US011404122B2

(12) United States Patent
Chibvongodze et al.

(10) Patent No.: US 11,404,122 B2
(45) Date of Patent: Aug. 2, 2022

(54) SUB-BLOCK SIZE REDUCTION FOR 3D NON-VOLATILE MEMORY

(71) Applicant: SANDISK TECHNOLOGIES LLC, Addison, TX (US)

(72) Inventors: Hardwell Chibvongodze, Hiratsuka (JP); Masatoshi Nishikawa, Nagoya (JP)

(73) Assignee: SanDisk Technologies LLC, Addison, TX (US)

( * ) Notice: Subject to any disclaimer, the term of this patent is extended or adjusted under 35 U.S.C. 154(b) by 45 days.

(21) Appl. No.: 17/102,430

(22) Filed: Nov. 23, 2020

(65) Prior Publication Data
US 2021/0082506 A1 Mar. 18, 2021

Related U.S. Application Data

(62) Division of application No. 16/432,304, filed on Jun. 5, 2019, now Pat. No. 10,878,907.

(51) Int. Cl.
*G11C 16/04* (2006.01)
*H01L 27/11524* (2017.01)
(Continued)

(52) U.S. Cl.
CPC .......... *G11C 16/0483* (2013.01); *G11C 16/08* (2013.01); *G11C 16/16* (2013.01);
(Continued)

(58) Field of Classification Search
CPC ......... H01L 27/11524; H01L 27/11529; H01L 27/11556; H01L 27/1157; H01L 27/11582; G11C 16/16; G11C 16/14; G11C 16/0483
See application file for complete search history.

(56) References Cited

U.S. PATENT DOCUMENTS 6,295,227 B1 9/2001 Sakui et al.
6,850,439 B1 2/2005 Tanaka
(Continued)

FOREIGN PATENT DOCUMENTS

JP 2011170953 A 9/2011
JP 2012069606 A 4/2012
(Continued)

OTHER PUBLICATIONS

Office Action dated Jun. 29, 2020, U.S. Appl. No. 16/432,304.
(Continued)

*Primary Examiner* — Uyen Smet
(74) *Attorney, Agent, or Firm* — Vierra Magen Marcus LLP

(57) ABSTRACT

Systems and methods for reducing the size of sub-blocks within a physical memory block for a three-dimensional non-volatile memory using buried source lines are described. The physical memory block may be fabricated using dual buried source lines such that sub-blocks within the physical memory block may be individually selected in both a horizontal word line direction and a vertical NAND string direction. The physical memory block may include a plurality of sub-blocks that are individually selectable and that share bit lines and/or source-side select gate lines. The plurality of sub-blocks that are individually selectable may correspond with different portions of the same NAND string in which a first sub-block of the plurality of sub-blocks connects to a drain-side select gate for the NAND string and a second sub-block of the plurality of sub-blocks connects to a source-side select gate for the NAND string.

20 Claims, 18 Drawing Sheets

(51) Int. Cl.
*H01L 27/11529* (2017.01)
*H01L 27/11556* (2017.01)
*H01L 27/1157* (2017.01)
*G11C 16/26* (2006.01)
*H01L 27/11582* (2017.01)
*G11C 16/24* (2006.01)
*G11C 16/08* (2006.01)
*G11C 16/16* (2006.01)
*H01L 27/11573* (2017.01)

(52) U.S. Cl.
CPC .............. *G11C 16/24* (2013.01); *G11C 16/26* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(56) References Cited

U.S. PATENT DOCUMENTS

| | | | |
|---|---|---|---|
| 9,430,376 B2 | 4/2016 | Horn | |
| 9,953,717 B2 | 4/2018 | Sabde | |
| 10,381,083 B1* | 8/2019 | Yang | G11C 16/16 |
| 2005/0052918 A1 | 3/2005 | Dormans | |
| 2013/0250700 A1 | 9/2013 | La Rosa | |
| 2015/0023103 A1* | 1/2015 | Aritome | G11C 16/04 |
| | | | 365/185.12 |
| 2017/0330628 A1 | 11/2017 | Oh | |

FOREIGN PATENT DOCUMENTS

| | | |
|---|---|---|
| JP | 2013200913 A | 10/2013 |
| JP | 2019511802 A | 4/2019 |
| KR | 20170070206 A | 6/2017 |
| KR | 20170126772 A | 11/2017 |
| KR | 20180001710 A | 1/2018 |
| KR | 20180057260 A | 5/2018 |
| KR | 20180135576 A | 12/2018 |
| KR | 20190079305 A | 7/2019 |

OTHER PUBLICATIONS

Response to Office Action dated Aug. 2, 2020, U.S. Appl. No. 16/432,304.

Notice of Allowance dated Sep. 1, 2020, U.S. Appl. No. 16/432,304.

* cited by examiner

SUB-BLOCK SIZE REDUCTION FOR 3D NON-VOLATILE MEMORY

The application claims priority to U.S. patent application Ser. No. 16/432,304, filed on Jun. 5, 2019, published as US 2020/0388335 on Dec. 10, 2020 and issued as U.S. Pat. No. 10,878,907 on Dec. 29, 2020, titled "Sub-Block Size Reduction for 3D Non-Volatile Memory," incorporated herein by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM typically utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature.

DETAILED DESCRIPTION

Figure 1A:
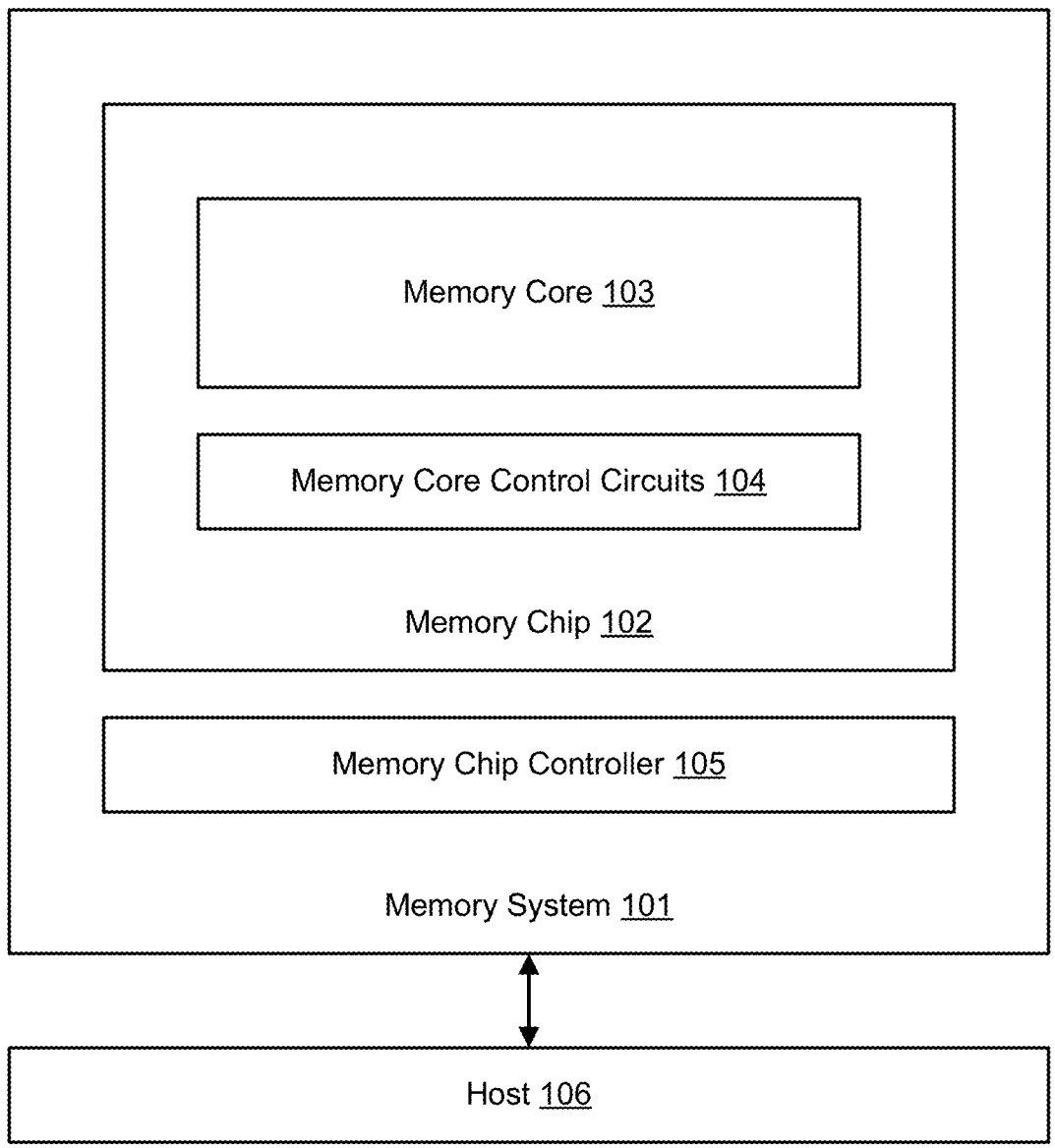
FIGS. 1A-1F depict various embodiments of a memory system.

Technology is described for reducing the size of sub-blocks within a physical memory block for a three-dimensional non-volatile memory. The physical memory block may be fabricated using dual buried source lines such that sub-blocks within the physical memory block may be individually selected or unselected in both a horizontal direction (e.g., the word line direction) and a vertical direction (e.g., the NAND string direction). The physical memory block may include a plurality of sub-blocks that are individually selectable and that share bit lines and/or source-side select gate lines. The physical memory block may include a plurality of sub-blocks that are individually selectable that comprise different portions of the same NAND string in which a first sub-block of the plurality of sub-blocks connects to a drain-side select gate for the NAND string and a second sub-block of the plurality of sub-blocks connects to a source-side select gate for the NAND string. In one example, the physical memory block may include four sub-blocks, wherein two sub-blocks of the four sub-blocks are arranged vertically within the physical memory block (e.g., a first sub-block of the two sub-blocks is physically formed above a second sub-block of the two sub-blocks) and wherein a first portion of the NAND string corresponds with a first sub-block of the two sub-blocks and a second portion of the NAND string corresponds with a second sub-block of the two sub-blocks.

In another example, the physical memory block may include four sub-blocks that are individually selectable, wherein two sub-blocks of the four sub-blocks are arranged horizontally within the physical memory block and wherein a source-side select line connects to a first source-side select gate transistor of a first NAND string that extends through a first sub-block of the two sub-blocks and the source-side select line connects to a second source-side select gate transistor of a second NAND string that extends through a second sub-block of the two sub-blocks. In this case, a bit line formed above the two sub-blocks may connect to both a first drain-side select gate transistor of the first NAND string and to a second drain-side select gate of the second NAND string. The first source-side select gate transistor may abut or connect to a first buried source line and the second source-side select gate transistor may abut or connect to a second buried source line that is electrically isolated from the first buried source line. In one example, the first buried source line may be electrically isolated from the second buried source line due to an etching step during fabrication of the physical memory block that severs a common source line connection. The first buried source line may be electrically isolated from the second buried source line by a layer of silicon dioxide or an electrical insulating layer.

In some embodiments, two buried source lines per physical memory block may be formed and connected to two sub-blocks within the physical memory block. The two buried source lines may allow individual sub-blocks within the physical memory block to be individually selected or unselected along both the horizontal word line direction and/or the vertical NAND string direction. In one example, a three-dimensional memory structure may include a physical block with a first buried source line that forms the source line connections for a first sub-block of the physical block and a second buried source line that forms the source line connections for a second sub-block of the physical block. The first buried source line and the second buried source line may be independently biased. For example, the first buried source line may be set to an erase voltage (e.g., 22V) during an erase operation while the second buried source line is set to VSS or 0V during the erase operation.

One technical issue with increasing the string lengths of vertical NAND strings or increasing the number of word line layers per physical memory block is that the overall size of the physical memory block will also increase (e.g., from 9 MB to 36 MB). The larger memory block size may make garbage collection inconvenient and reduce memory block yields due to an increased number of bad blocks. One technical benefit of using dual buried source lines per physical memory block is that smaller sub-blocks within the physical memory block may be individually selected and unselected leading to improved block yields and garbage collection.

In some embodiments, during an erase operation for a sub-block of a physical memory block, holes may be injected from a buried source layer or injected from a bit line depending on the biasing conditions for the physical memory block. In some embodiments, two individually selectable sub-blocks within a physical memory block may share a NAND string and two-sided erase operations may be performed on the NAND string in which a source-side erase operation for erasing a second set of memory cell transistors from the source-side of the NAND string injects holes from a buried source line and a drain-side erase operation for erasing a first set of memory cell transistors from the drain-side of the NAND string uses gate induced drain leakage (GIDL).

In some embodiments, the physical memory block may include one or more memory block tiers. One or more dummy word lines may be arranged within the physical memory block to isolate or connect the memory block tiers during a memory operation (e.g., during a programming or erase operation). Alternatively, one or more tier select gate transistors may also be used to isolate or connect the memory block tiers during the memory operation. In this case, a NAND string that extends through the one or more memory block tiers within the physical memory block may include one or more tier select gate transistors positioned between different portions of the NAND string. In one example, the NAND string may extend through two memory string tiers (e.g., two sub-strings corresponding with two individually selectable sub-blocks) that may be electrically connected together or electrically isolated via the one or more tier select gate transistors. The first memory string tier may comprise a first set of memory cell transistors (e.g., floating gate or charge trap transistors) that may be programmed to store a first set of data and the second memory string tier may comprise a second set of memory cell transistors that are arranged above the first set of transistors and that may be programmed to store a second set of data. Between the first set of memory cell transistors and the second set of memory cell transistors may comprise a tier select gate transistor and/or one or more dummy word lines in series with the first set of memory cell transistors and the second set of memory cell transistors. The tier select gate transistor may comprise a programmable transistor (e.g., a floating gate transistor or a charge trap transistor) or a non-programmable transistor (e.g., an NMOS transistor, a PMOS transistor, or a transistor without a charge trap layer to modify the transistor threshold voltage of the transistor).

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
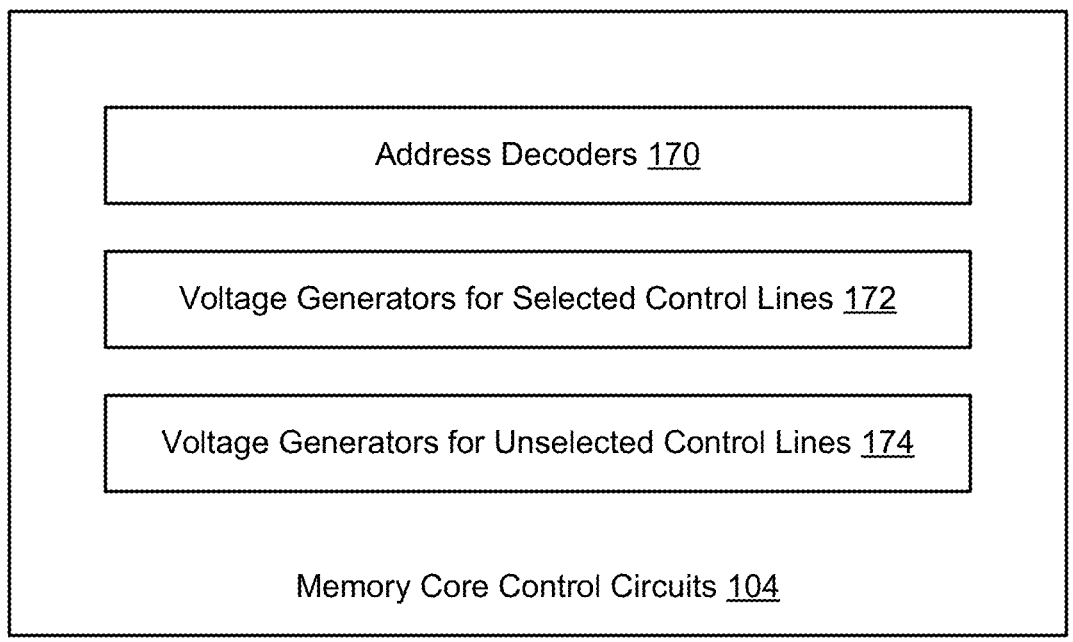

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
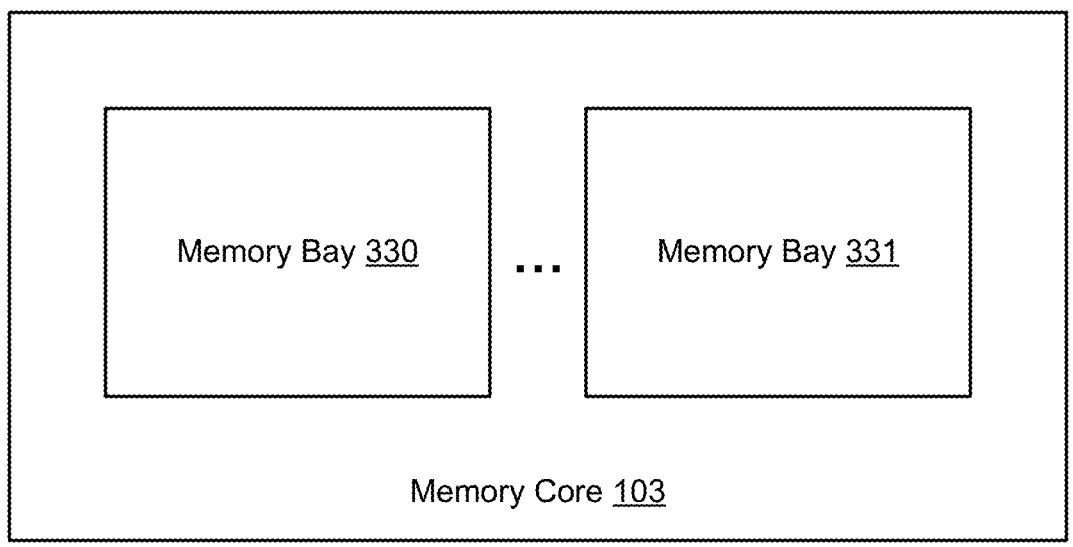

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
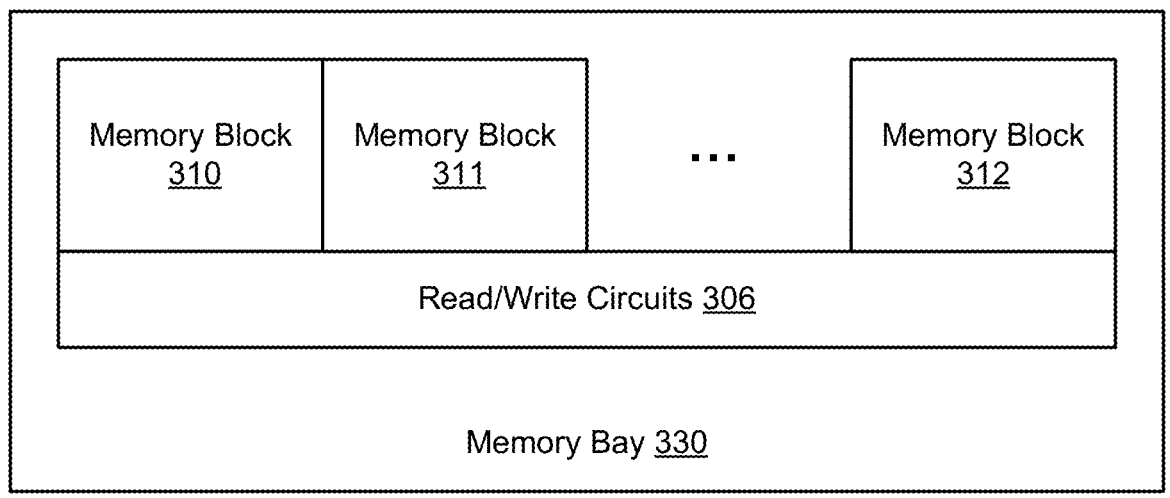

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
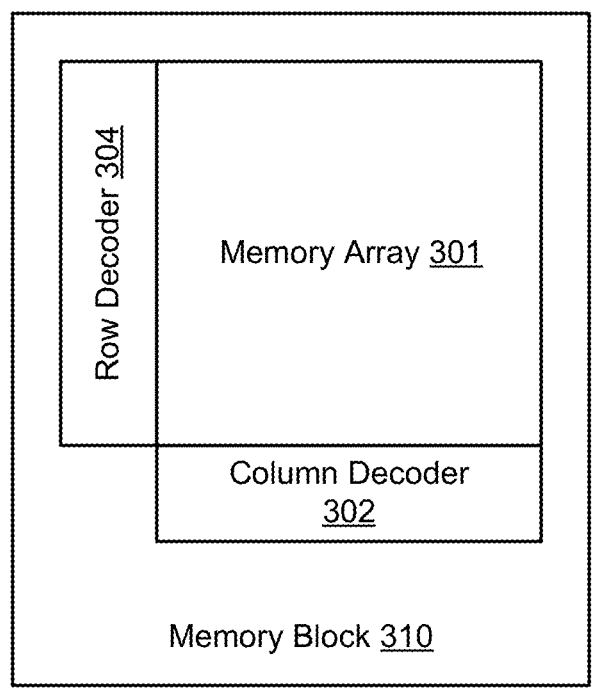

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
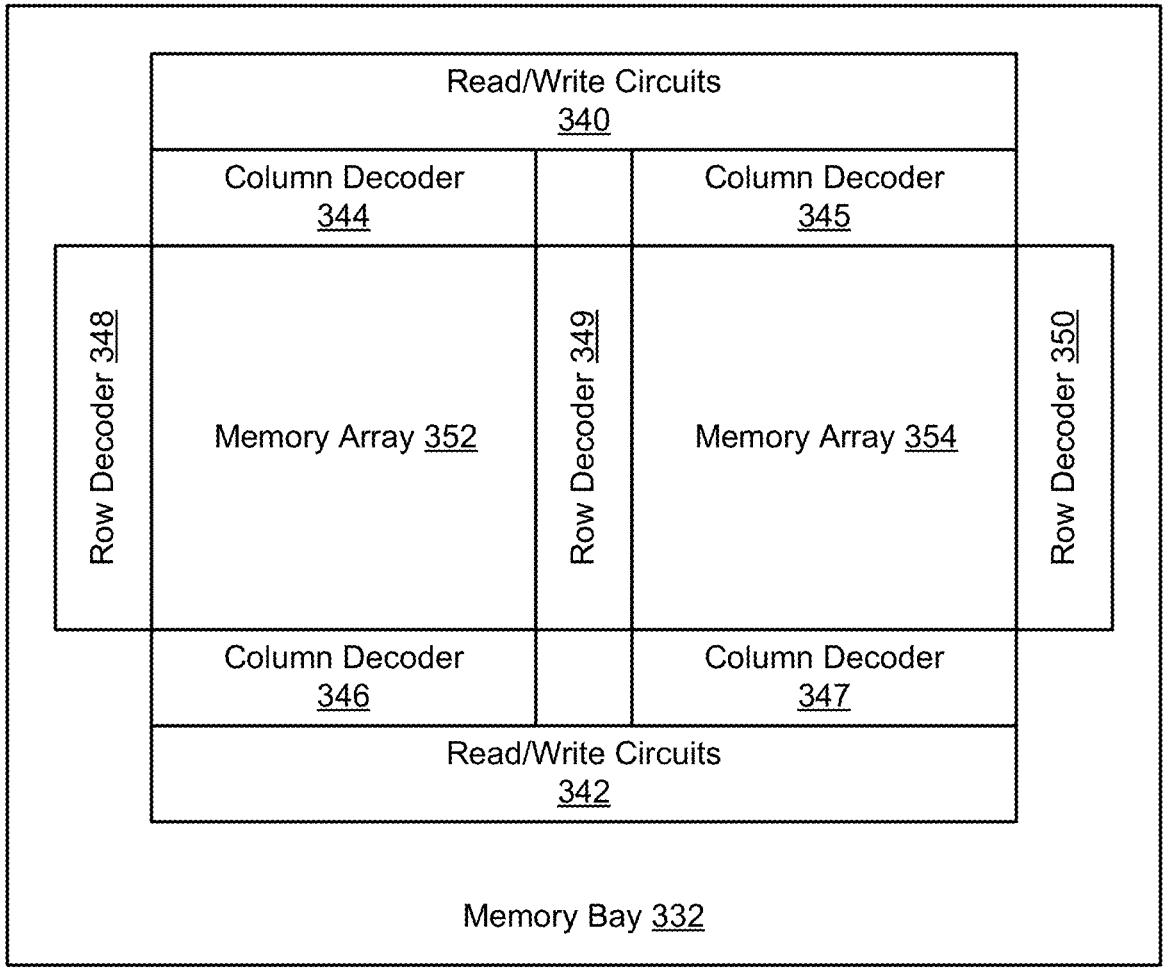

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2:
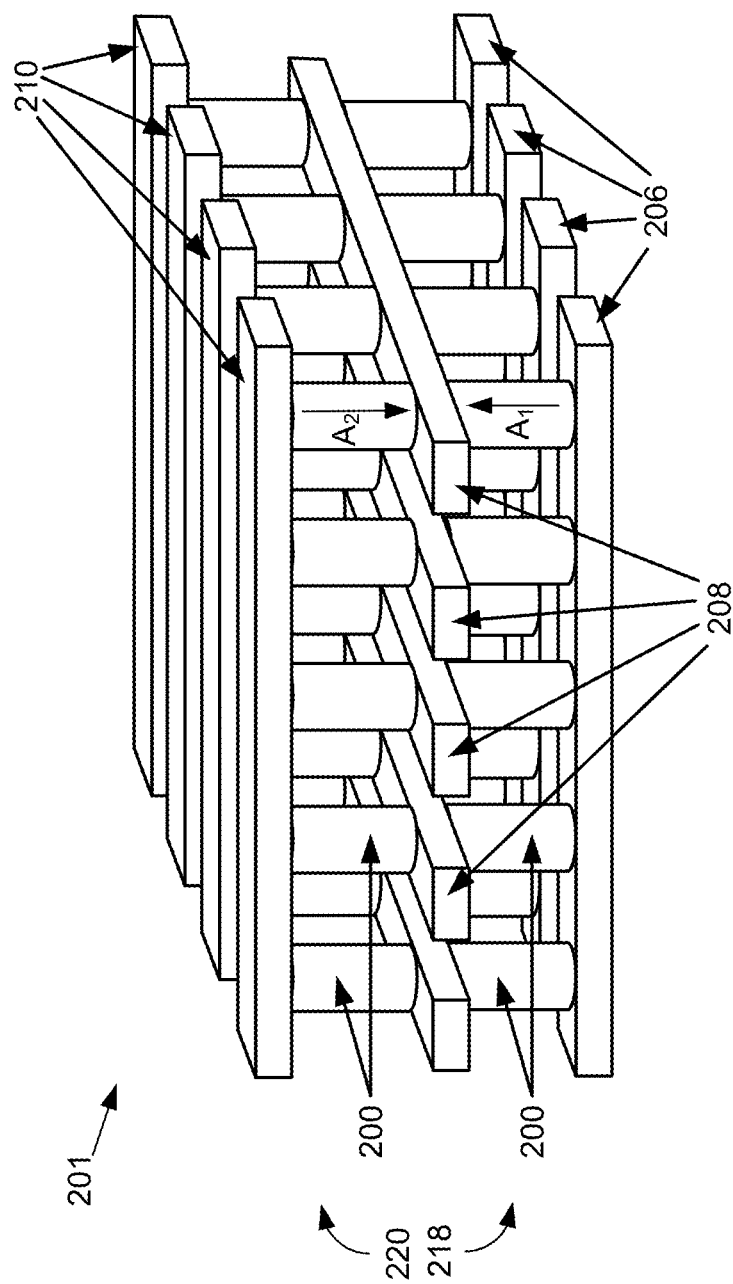
FIG. 2 depicts one embodiment of a portion of a monolithic three-dimensional memory array.

FIG. 2 depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2 may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

Figure 3:
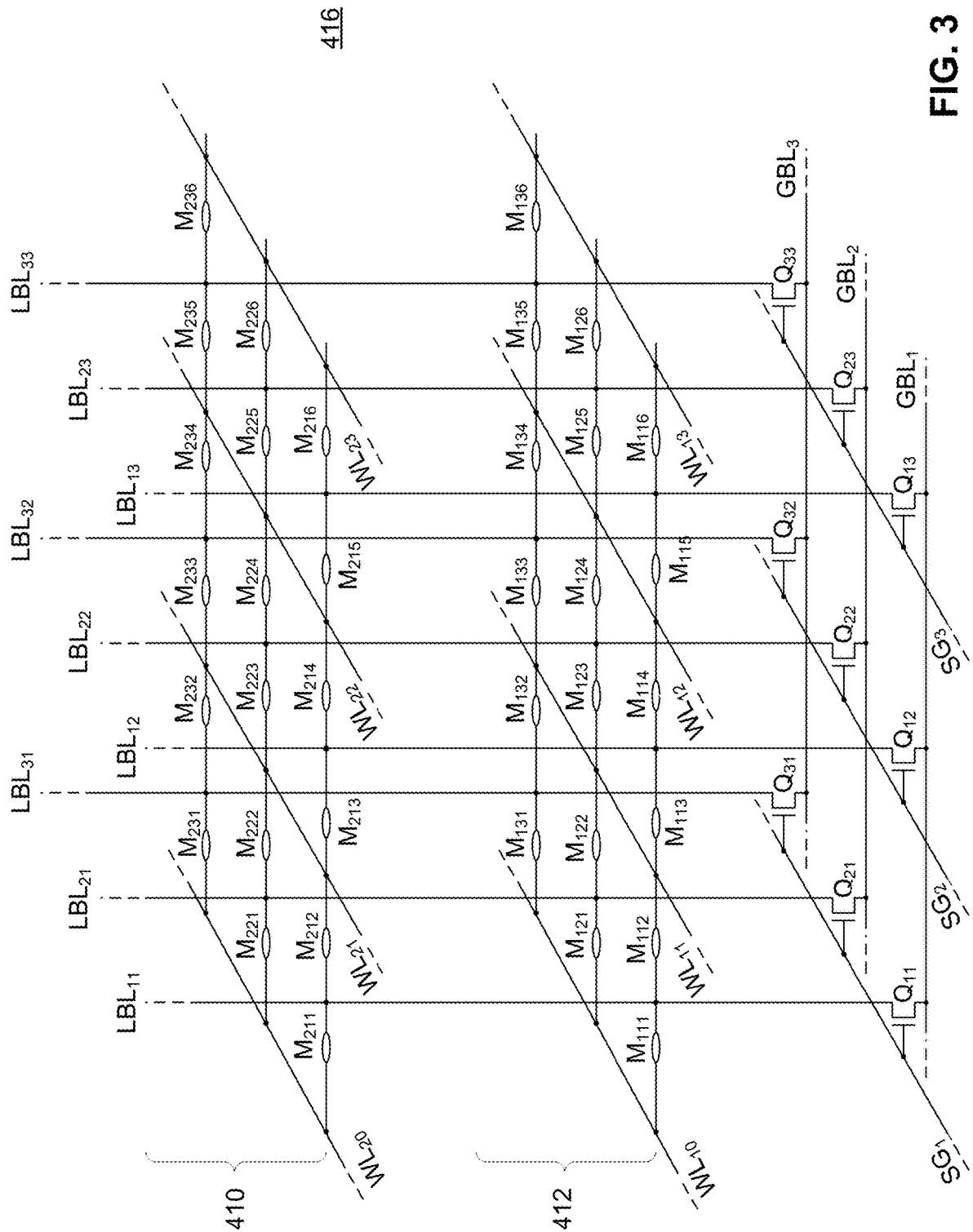
FIG. 3 depicts another embodiment of a portion of a monolithic three-dimensional memory array.

FIG. 3 depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4:
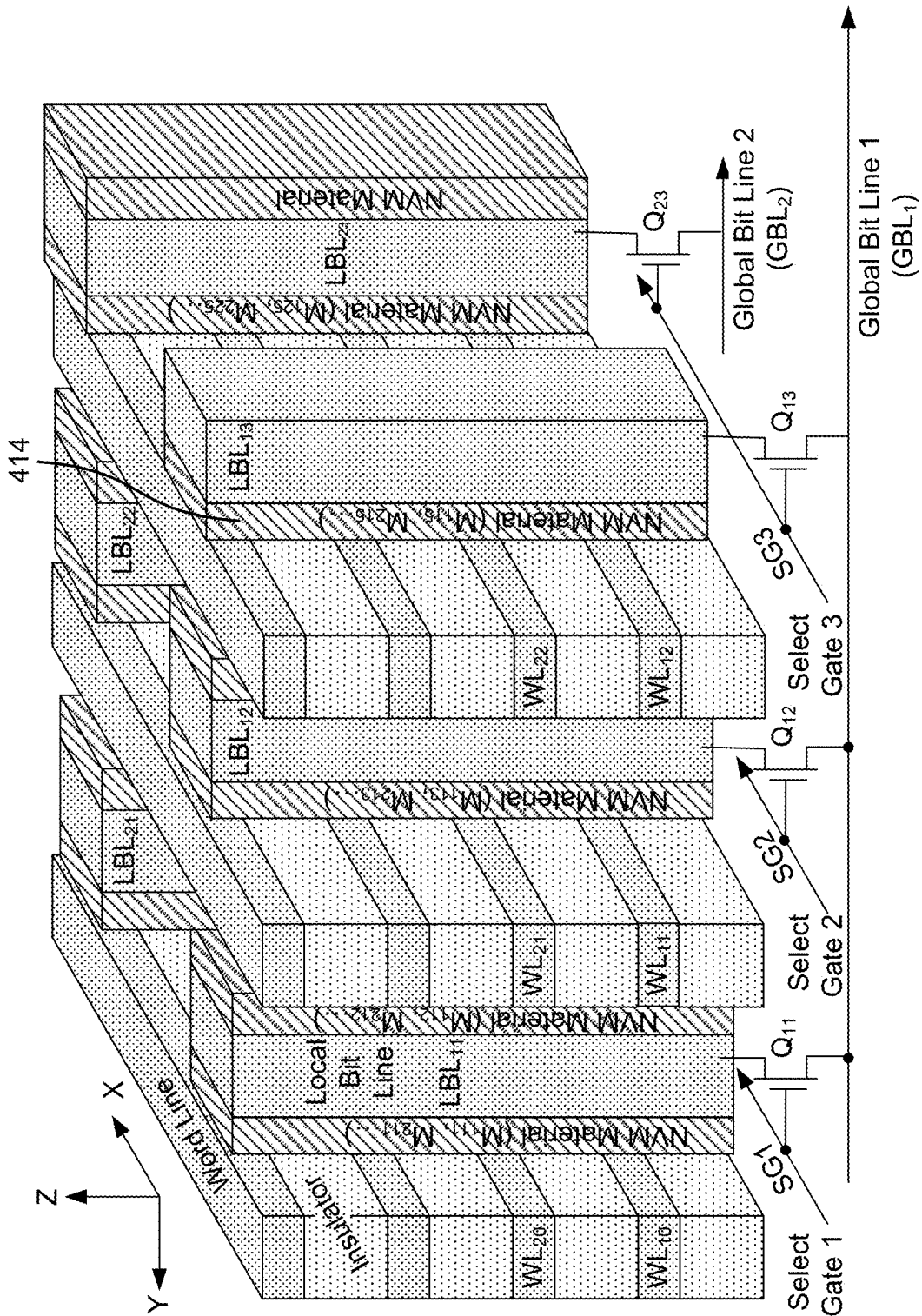
FIG. 4 depicts one embodiment of a portion of a monolithic three-dimensional memory array that includes vertical strips of a non-volatile memory material.

FIG. 4 depicts one embodiment of a portion of a monolithic three-dimensional memory array that includes vertical strips of a non-volatile memory material. The physical structure depicted in FIG. 4 may comprise one implementation for a portion of the monolithic three-dimensional memory array depicted in FIG. 3. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
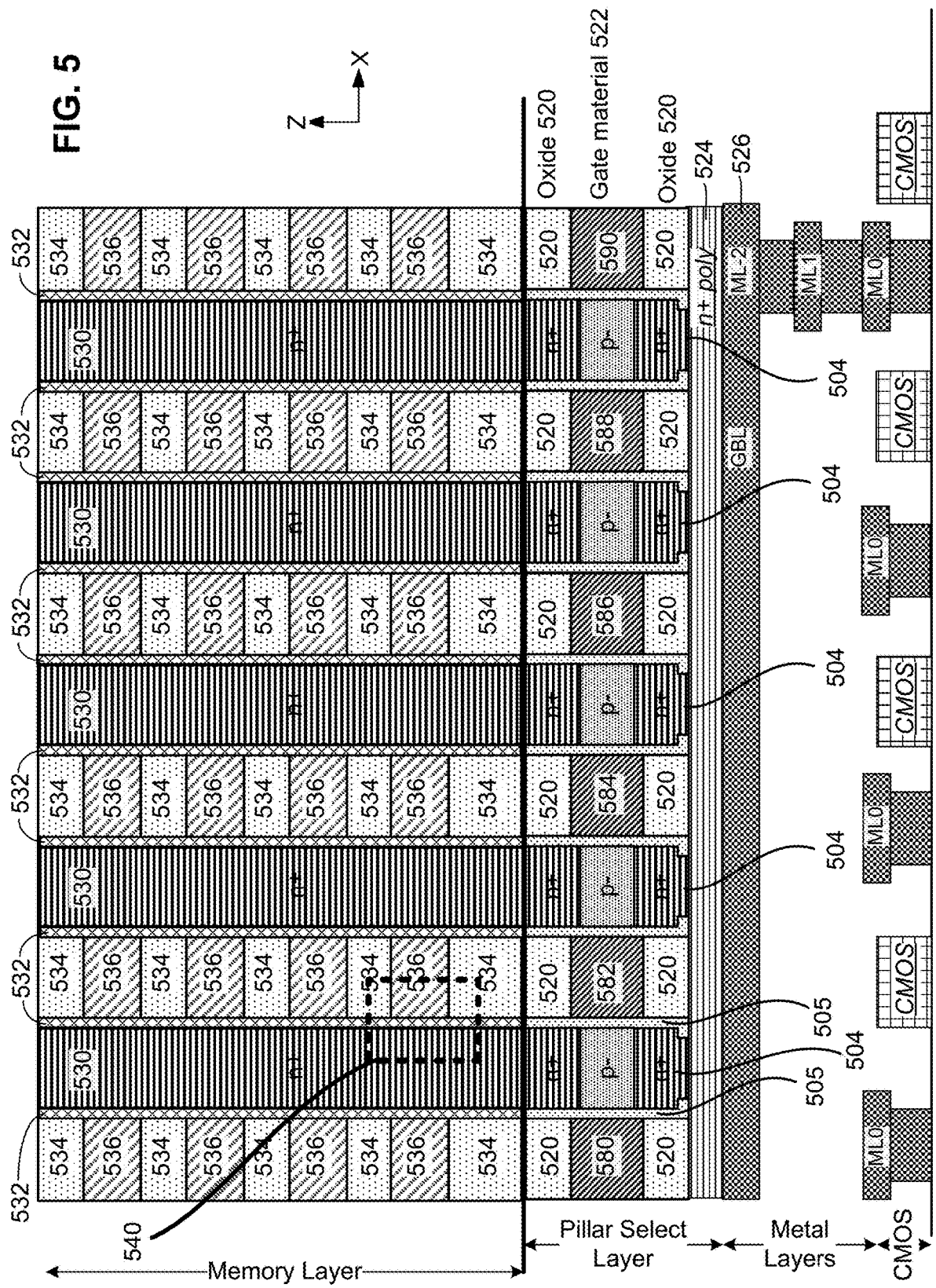
FIG. 5 depicts a cross-sectional view of a memory structure using the vertically oriented select devices shown in FIG. 4.

FIG. 5 depicts a cross-sectional view of a memory structure using the vertically oriented select devices shown in FIG. 4. The memory structure of FIG. 5 may comprise a continuous mesh array of memory elements because there are memory elements connected to both sides of the bit lines and memory elements connected to both sides of the word lines. At the bottom of FIG. 5, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 4), which are labeled in FIG. 5 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 5 also shows an n+ polysilicon layer 524. As depicted, the npn TFT of vertically oriented select devices 504 can be used to connect the global bit line GBL (layer 526) with any of the vertical bit lines 530.

Moreover, FIG. 5 shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (ME). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 6A:
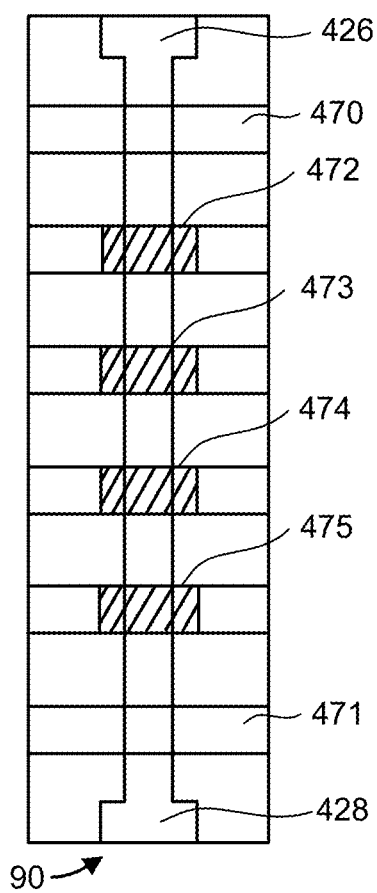
FIG. 6A depicts one embodiment of a NAND string.
Figure 6B:
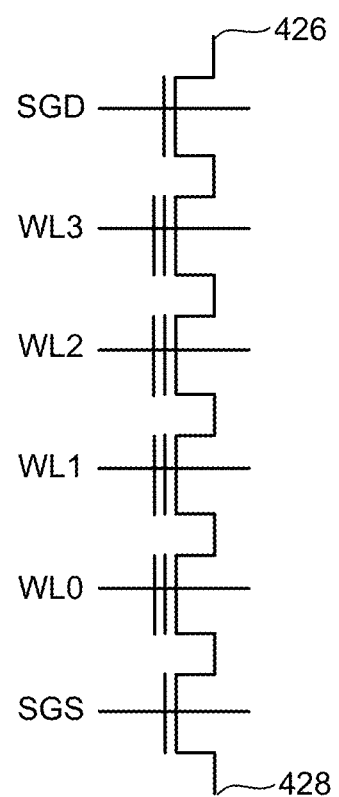
FIG. 6B depicts one embodiment of the NAND string of FIG. 6A using a corresponding circuit diagram.

FIG. 6A depicts one embodiment of a NAND string 90. FIG. 6B depicts one embodiment of the NAND string of FIG. 6A using a corresponding circuit diagram. As depicted, NAND string 90 includes four transistors 472-475 in series between a first select gate 470 (i.e., a drain-side select gate) and a second select gate 471 (i.e., a source-side select gate). Select gate 470 connects the NAND string 90 to a bit line 426 and is controlled by applying the appropriate voltage to the select line SGD. In this case, the bit line 426 is directly connected to the drain side end of the NAND string. Select gate 471 connects the NAND string 90 to a source line 428 and is controlled by applying the appropriate voltage to the select line SGS. In this case, the source line 428 is directly connected to the source-side end of the NAND string 90. The gates of transistors 472-475 are connected to word lines WL3, WL2, WL1, and WL0, respectively.

Note that although FIGS. 6A-6B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a p-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Figure 6C:
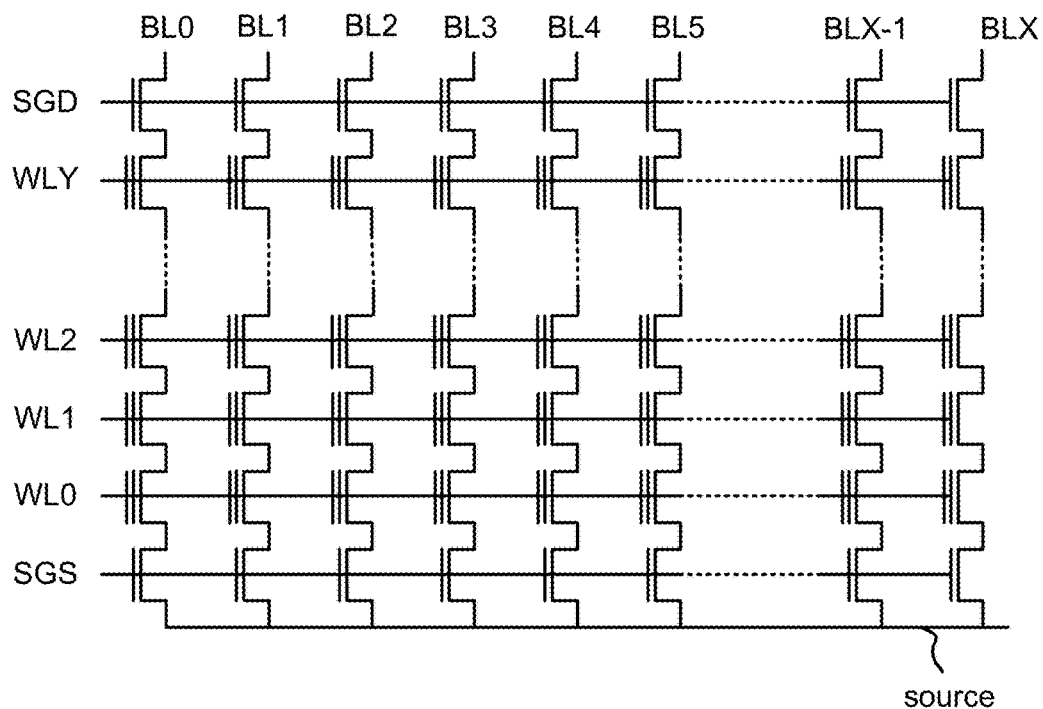
FIG. 6C depicts one embodiment of a memory block including a plurality of NAND strings.

FIG. 6C depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are several ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

In some cases, during a read operation or a sensing operation, the source-side selection signal SGS may be set to a particular voltage (e.g., 7V or 10V) to pass the voltage applied to the source line (source) to the source junction of the floating gate transistors whose gates are connected to WL0 or the word line closest to the source-side select gate.

Figure 6D:
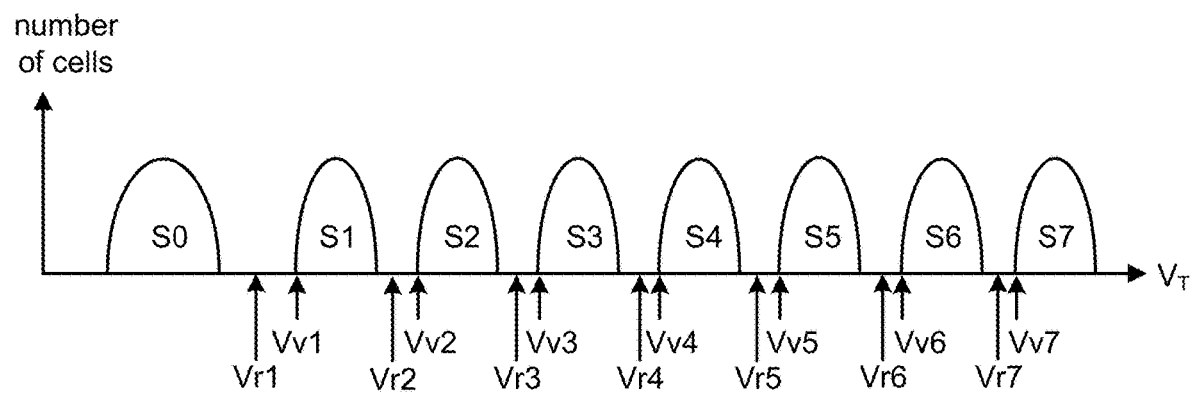
FIG. 6D depicts one embodiment of possible threshold voltage distributions (or data states) for a three-bit-per-cell memory cell.

FIG. 6D depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 7A:
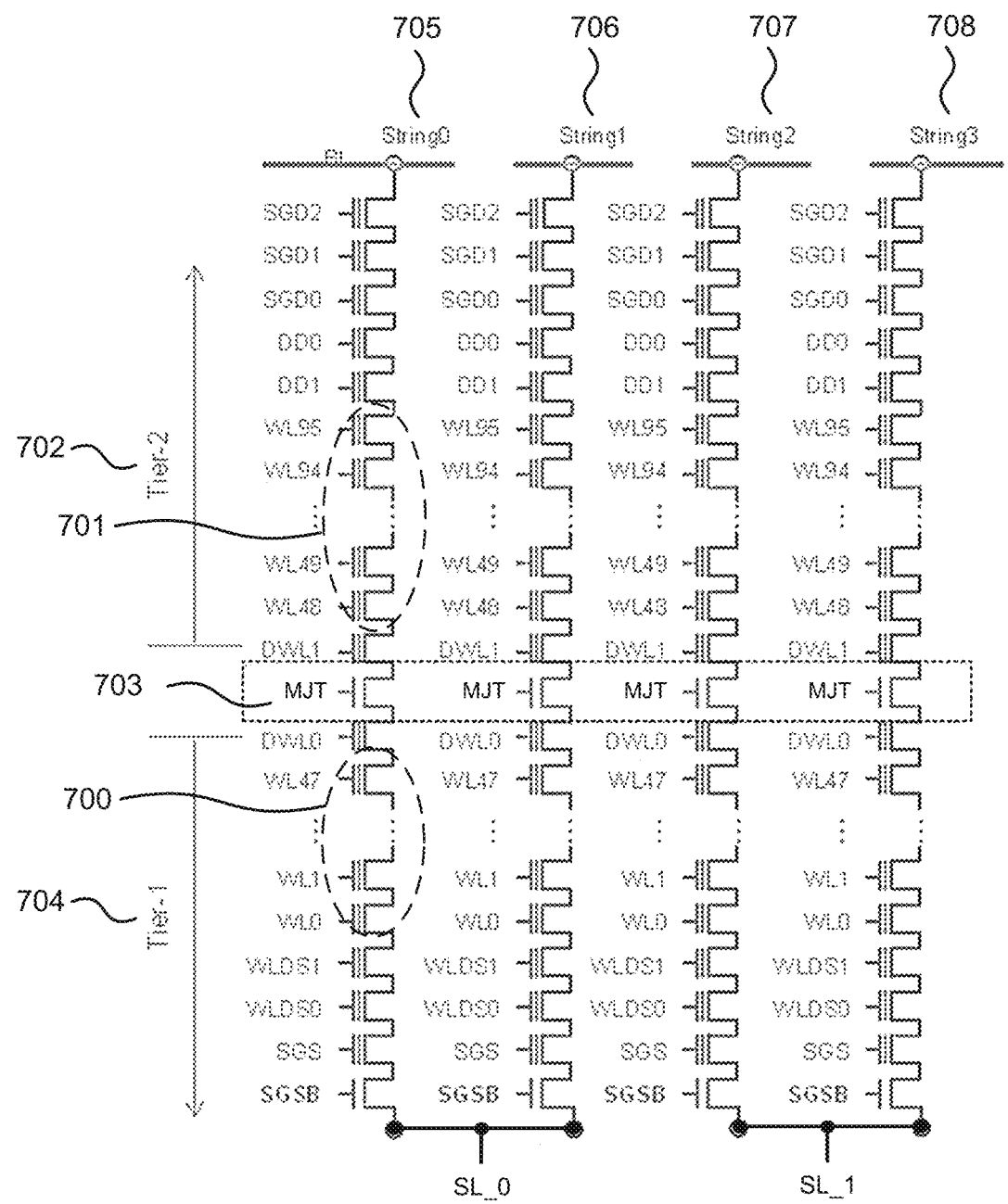
FIG. 7A depicts one embodiment of four NAND strings.

FIG. 7A depicts one embodiment of four NAND strings 705-708. Each of the NAND strings comprises a first portion of the NAND string (e.g., corresponding with a first tier of memory cell transistors 704), a second portion of the NAND string (e.g., corresponding with a second tier of memory cell transistors 702), and a tier select gate transistor 703 arranged between the first portion of the NAND string and the second portion of the NAND string. The tier select gate transistor 703 may comprise an NMOS transistor without a charge trap layer between the channel of the NMOS transistor and the gate of the NMOS transistor.

In some embodiments, the electrical isolation between the two tiers of memory cell transistors may be performed by biasing the dummy word lines DWL1 and DWL0 instead of setting a dedicated tier select gate transistor into a non-conducting state (e.g., the tier select gate transistors may be removed or omitted from the NAND strings). The first portion of the NAND string includes memory cell transistors corresponding with word lines WL0-WL47, a memory cell transistor connected to dummy word line DWL0 that is arranged between the tier select gate transistor 703 and the memory cell transistor connected to word line WL47, the memory cell transistors connected to dummy word lines WLDS1 and WLDS0 on the source-side and arranged between the memory cell transistor connected to word line WL0 and the source-side select gate that is controlled by the source-side select gate line SGS, and the source-side select gates controlled by source-side select gate lines SGS and SGSB. The second portion of the NAND string includes memory cell transistors corresponding with word lines WL48-WL95, a memory cell transistor connected to dummy word line DWL1 and arranged between the tier select gate transistor 703 and the memory cell transistor connected to word line WL48, the memory cell transistors connected to dummy word lines DD1 and DD0 on the drain-side and arranged between the memory cell transistor connected to word line WL95 and the drain-side select gate connected to SGD0, and the drain-side select gates controlled by SGD0-SGD2. As depicted in FIG. 7A, the source line SL_0 comprises the source-side connections to NAND strings 705-706 and the source line SL_1 comprises the source-side connections to NAND strings 707-708. The source line SL_0 may correspond with a first buried source line and the source line SL_1 may correspond with a second buried source line that is electrically isolated from the first buried source line.

In one embodiment, during an erase operation for erasing the memory cells 701 within the second tier of memory cell transistors 702 that correspond with the memory cell transistors connected to word lines WL48-WL95, the word lines WL48-WL95 may be set to VSS or 0V, the bit line connected to the NAND string 705 may be set to an erase voltage (e.g., to a voltage between 18V and 23V), the drain-side select gate lines SGD0-SGD2 may be set to a voltage equal to or less than the erase voltage (e.g., to a voltage between 11V and 17V), the word lines WL0-WL47 may be floated or set to 0V, the source-side select gate lines SGS and SGSB may be set to 0V, and the source line SL_0 may be set to 0V. During the erase operation for the memory cells 701, the tier select gate transistor 703 may be set into a non-conducting state. In cases where the tier select gate transistor 703 is omitted, the memory cell transistors controlled by dummy word lines DWL1 and DWL0 may be set into a non-conducting state while the memory cells 701 are erased.

In another embodiment, during an erase operation for erasing the memory cells 700 within the first tier of memory cell transistors 704 that correspond with the memory cell transistors connected to word lines WL0-WL47, the word lines WL0-WL47 may be set to VSS or 0V, the bit line connected to the NAND string 705 may be set to VSS or 0V, the drain-side select gate lines SGD0-SGD2 may be set to 0V, the word lines WL48-WL95 may be floated or set to 0V, the source-side select gate lines SGS and SGSB may be set to 16V, the source line SL_1 may be set to 0V, and the source line SL_0 may be set to the erase voltage (e.g., 22V or 23V). During the erase operation for the memory cells 700, the tier select gate transistor 703 may be set into a non-conducting state. In cases where the tier select gate transistor 703 is omitted, the memory cell transistors controlled by dummy word lines DWL1 and DWL0 may be set into a non-conducting state while the memory cells 700 are erased.

Figure 7B:
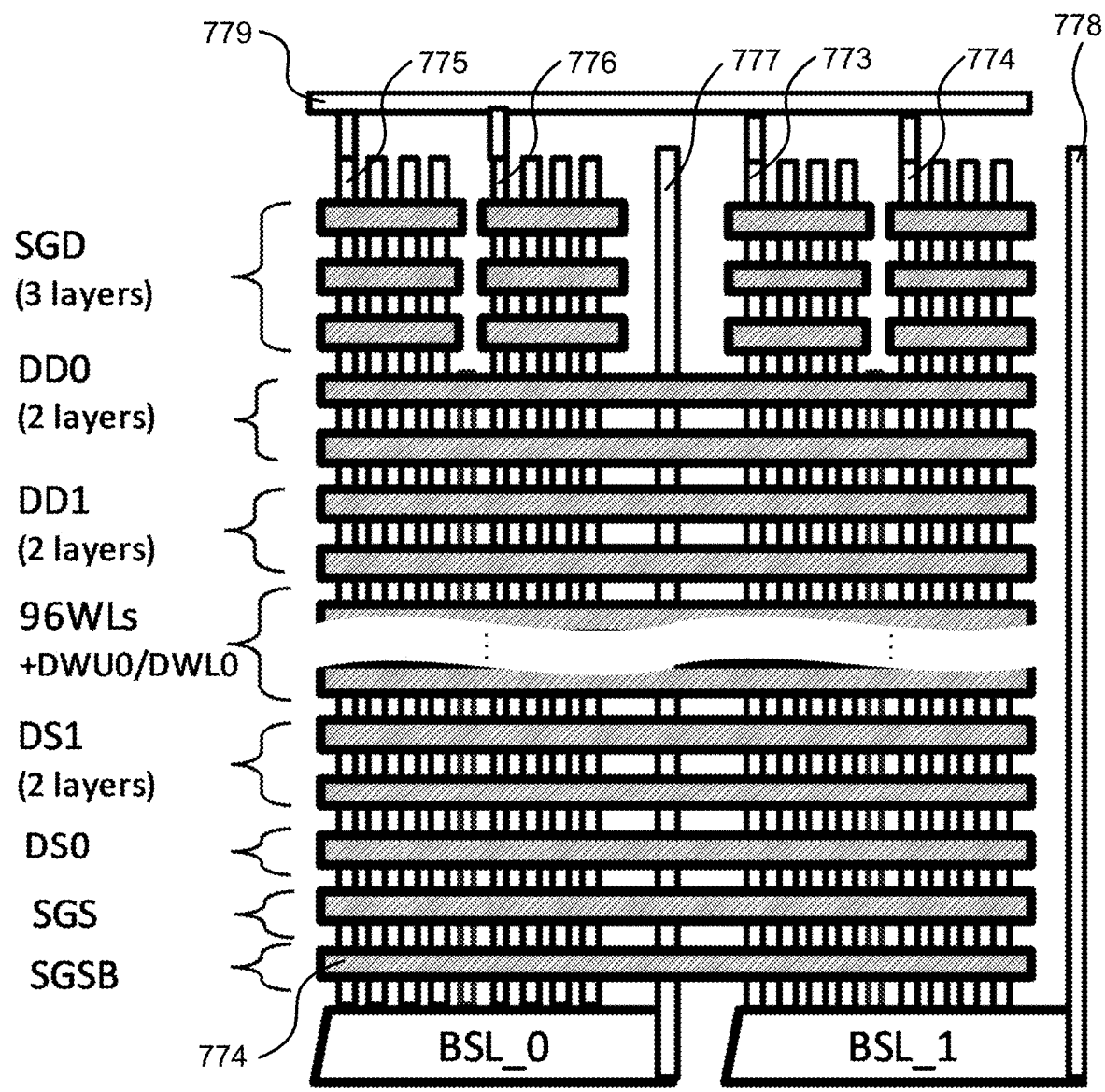
FIG. 7B depicts one embodiment of a NAND structure that includes four groups of NAND strings.

FIG. 7B depicts one embodiment of a NAND structure that includes four groups of NAND strings. Each of the four groups of NAND strings comprises four NAND strings. A first group of NAND strings includes a first NAND string 775 and a second group of NAND strings includes a second NAND string 776. A third group of NAND strings includes a third NAND string 773 and a fourth group of NAND strings includes a fourth NAND string 774. As depicted, a bit line 779 connects to the first NAND string 775, the second NAND string 776, the third NAND string 773, and the fourth NAND string 774. The first NAND string 775 includes three drain-side select gate transistors corresponding with the three SGD drain-side select gate lines, four drain-side dummy word line transistors corresponding with the DD0 and DD1 lines, 96 memory cell transistors corresponding with the 96 word lines, dummy word line transistors that are positioned in the middle of the 96 memory cell transistors to isolate a top tier of 48 memory cell transistors from a bottom tier of 48 memory cell transistors and that are driven by the DWU0 and DWL0 lines (the DWU0 and DWL0 lines may correspond with DWL1 and DWL0 in FIG. 7A with the tier select gate transistor 703 omitted), three source-side dummy word line transistors corresponding with the DS1 and DS0 lines, and two source-side select gate transistors corresponding with the source-side select gate lines SGS and SGSB. Both the first NAND string 775 and the second NAND string 776 connect to the buried source line BSL_0. Both the third NAND string 773 and the fourth NAND string 774 connect to the buried source line BSL_1. The buried source line BSL_0 may be biased to a first voltage (e.g., to an erase voltage) via a first source line connection 777 and the buried source line BSL_1 may be biased via a second source line connection 778 to a second voltage (e.g., to 0V) different from the first voltage. In some cases, such as during a read operation, both the first source line connection 777 and the second source line connection 778 may be biased to the same voltage. As depicted, the source-side select gate lines SGS and SGSB extend across all four groups of NAND strings.

Figure 7C:
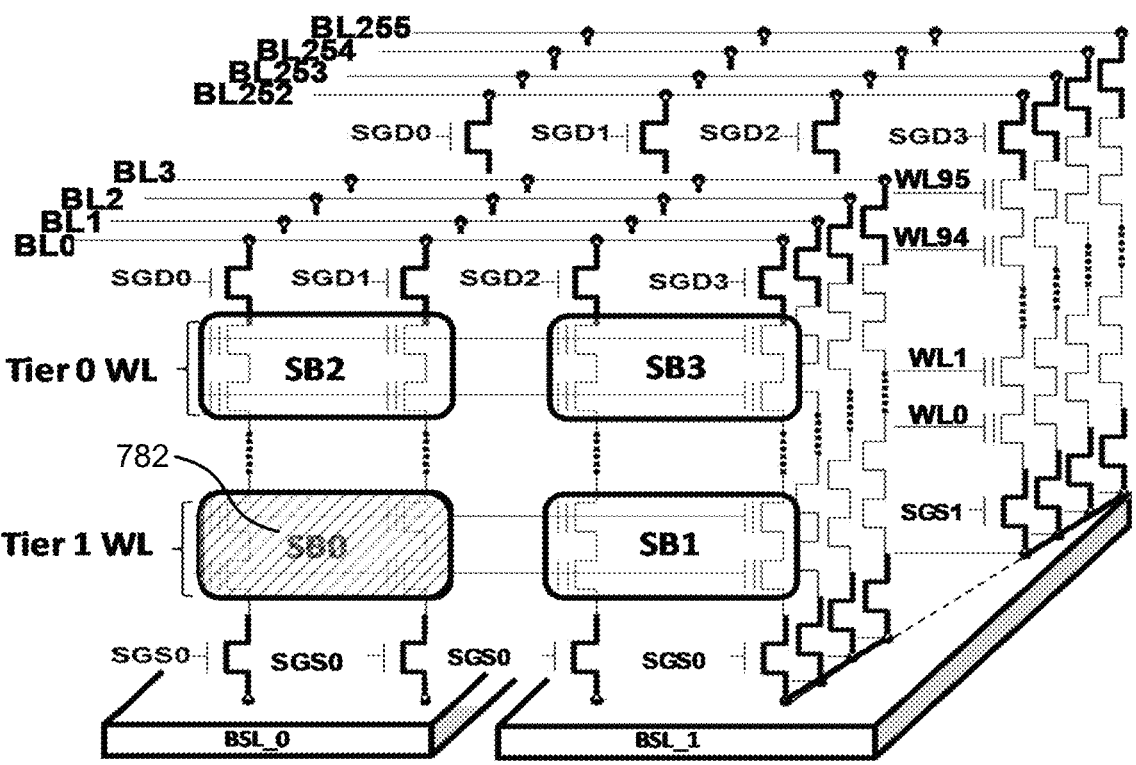
FIG. 7C depicts one embodiment of a physical memory block that includes four sub-blocks SB0-SB3.

FIG. 7C depicts one embodiment of a physical memory block that includes four sub-blocks SB0-SB3. During a memory operation, the sub-block SB0 782 may be selected, while the sub-blocks SB1-SB3 are unselected. In one example, an erase operation for erasing memory cell transistors within the sub-block SB0 782 may be performed while the sub-blocks SB1-SB3 are unselected and the memory cell transistors within the sub-blocks SB1-SB3 are not erased during the erase operation. As depicted, a first NAND string has a drain-side select gate controlled by the drain-side select gate line SGD0 and a source-side select gate controlled by the source-side select gate line SGS0, a second NAND string has a drain-side select gate controlled by the drain-side select gate line SGD1 and a source-side select gate controlled by the source-side select gate line SGS0, a third NAND string has a drain-side select gate controlled by the drain-side select gate line SGD2 and a source-side select gate controlled by the source-side select gate line SGS0, and a fourth NAND string has a drain-side select gate controlled by the drain-side select gate line SGD3 and a source-side select gate controlled by the source-side select gate line SGS0. The first NAND string and the second NAND string are connected to a first buried source line BSL_0. The third NAND string and the fourth NAND string are connected to a second buried source line BSL_1. A bit line BL0 connects to the four drain-side select gates driven by drain-side select gate lines SGD0-SGD3. In one embodiment, the first NAND string may correspond with the first NAND string 775 in FIG. 7B and the second NAND string may correspond with the second NAND string 776 in FIG. 7B.

Figure 7D:
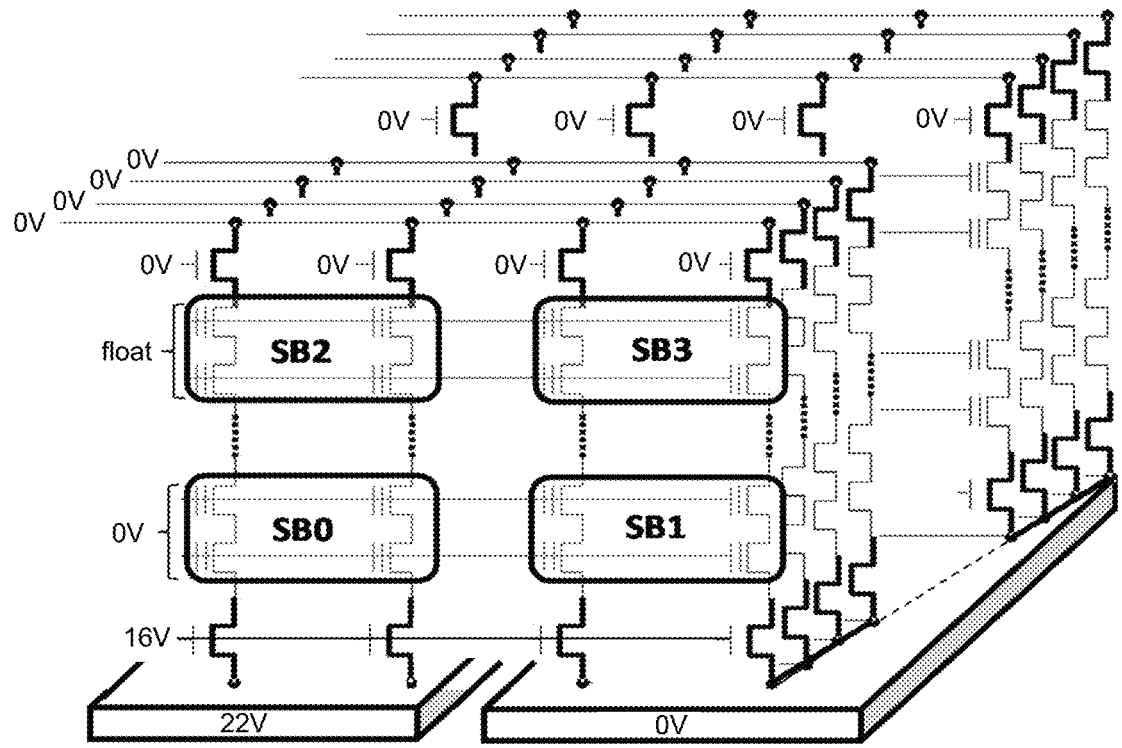
FIG. 7D depicts one embodiment of the physical memory block of FIG. 7C during an erase operation for the sub-block SB0.

FIG. 7D depicts one embodiment of the physical memory block of FIG. 7C during an erase operation for the sub-block SB0. As depicted, the bit lines that include bit line BL0 have been set to 0V, the drain-side select gate lines SGD0-SGD3 have been set to 0V, the word lines connecting to the gates of the memory cell transistors within the sub-blocks SB2 and SB3 have been floated, the word lines connecting to the gates of the memory cell transistors within the sub-blocks SB0 and SB1 have been set to 0V, the source-side select gate line SGS0 has been set to 16V, the first buried source line BSL_0 has been set to an erase voltage of 22V, and the second buried source line BSL_1 has been set to 0V. With these bias conditions, the memory cell transistors within the sub-block SB0 may be set into an erased state, while the memory cell transistors within the sub-blocks SB1-SB3 are unselected and not erased.

Figure 7E:
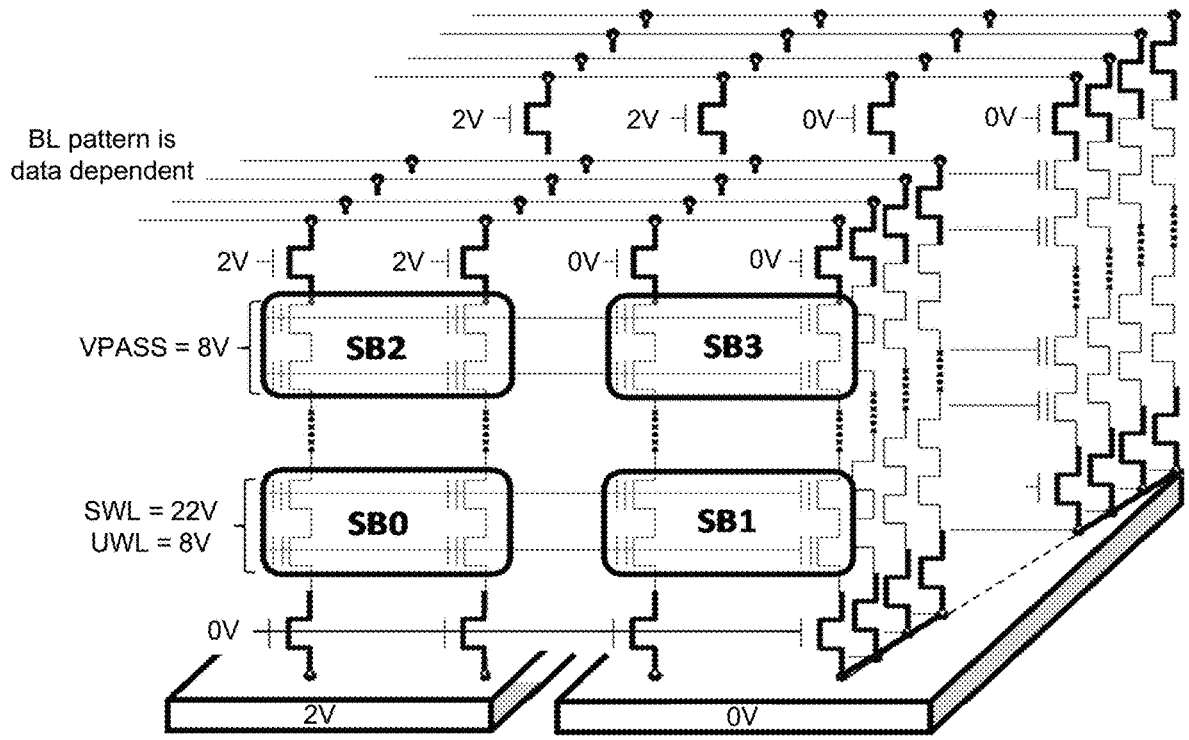
FIG. 7E depicts one embodiment of the physical memory block of FIG. 7C during a programming operation for the sub-block SB0.

FIG. 7E depicts one embodiment of the physical memory block of FIG. 7C during a programming operation for the sub-block SB0. As depicted, the bit lines that include bit line BL0 have been set to 0V or 2V depending on whether a memory cell transistor that is electrically connected to the bit line is to be programmed or program-inhibited (the bit line pattern is therefore data dependent), the drain-side select gate lines SGD0-SGD1 have been set to 2V, the drain-side select gate lines SGD2-SGD3 have been set to 0V, the word lines connecting to the gates of the memory cell transistors within the sub-blocks SB2 and SB3 have been set to a pass voltage of 8V, the unselected word lines (UWLs) connecting to the gates of the unselected memory cell transistors within the sub-blocks SB0 and SB1 have been set to the pass voltage of 8V, the selected word line (SWL) connecting to the gates of the selected memory cell transistors within the sub-blocks SB0 and SB1 has been set to the programming voltage of 22V, the source-side select gate line SGS0 has been set to 0V, the first buried source line BSL_0 has been set to 2V, and the second buried source line BSL_1 has been set to 0V. With these bias conditions, the memory cell transistors within the sub-block SB0 that are selected for programming may be set into a programmed data state, while the memory cell transistors within the sub-blocks SB1-SB3 are unselected and not programmed.

Figure 7F:
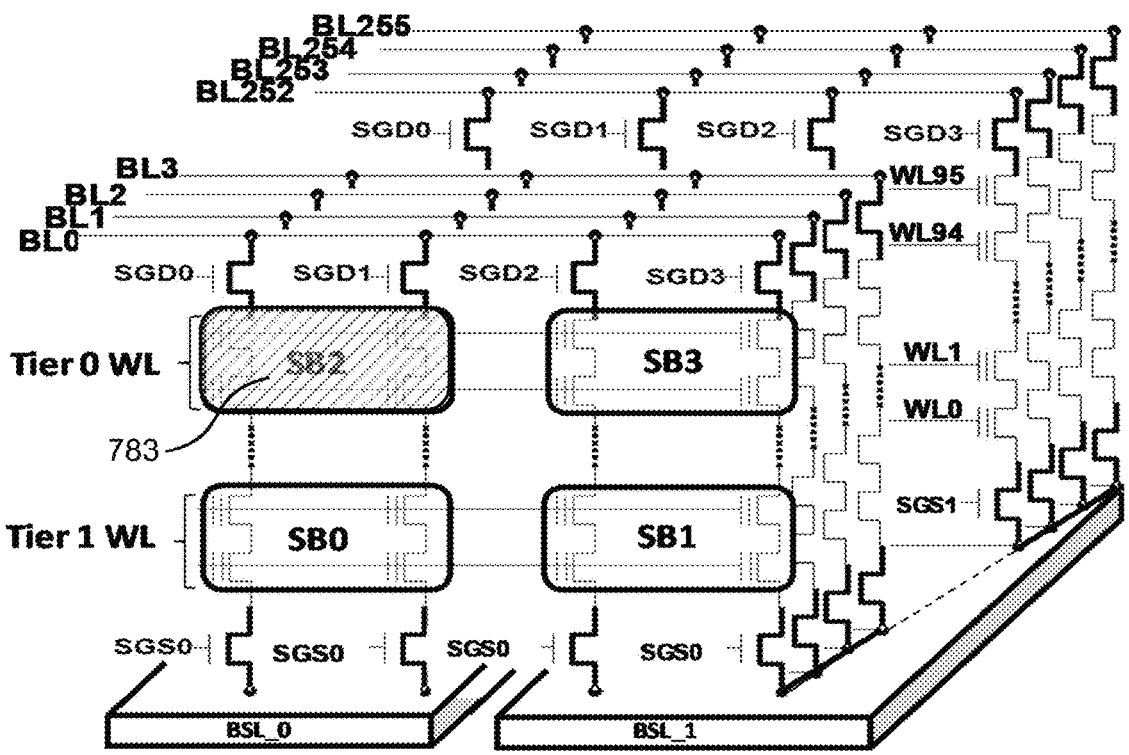
FIG. 7F depicts one embodiment of a physical memory block that includes four sub-blocks SB0-SB3.

FIG. 7F depicts one embodiment of a physical memory block that includes four sub-blocks SB0-SB3. During a memory operation, the sub-block SB2 783 may be selected, while the sub-blocks SB0-SB1 and SB3 are unselected. In one example, an erase operation for erasing memory cell transistors within the sub-block SB2 783 may be performed while the sub-blocks SB0-SB1 and SB3 are unselected and the memory cell transistors within the sub-blocks SB0-SB1 and SB3 are not erased during the erase operation. As depicted, a first NAND string has a drain-side select gate controlled by the drain-side select gate line SGD0 and a source-side select gate controlled by the source-side select gate line SGS0, a second NAND string has a drain-side select gate controlled by the drain-side select gate line SGD1 and a source-side select gate controlled by the source-side select gate line SGS0, a third NAND string has a drain-side select gate controlled by the drain-side select gate line SGD2 and a source-side select gate controlled by the source-side select gate line SGS0, and a fourth NAND string has a drain-side select gate controlled by the drain-side select gate line SGD3 and a source-side select gate controlled by the source-side select gate line SGS0. The first NAND string and the second NAND string are connected to a first buried source line BSL_0. The third NAND string and the fourth NAND string are connected to a second buried source line BSL_1. A bit line BL0 connects to the four drain-side select gates driven by drain-side select gate lines SGD0-SGD3. In one embodiment, the first NAND string may correspond with the first NAND string 775 in FIG. 7B and the second NAND string may correspond with the second NAND string 776 in FIG. 7B.

Figure 7G:
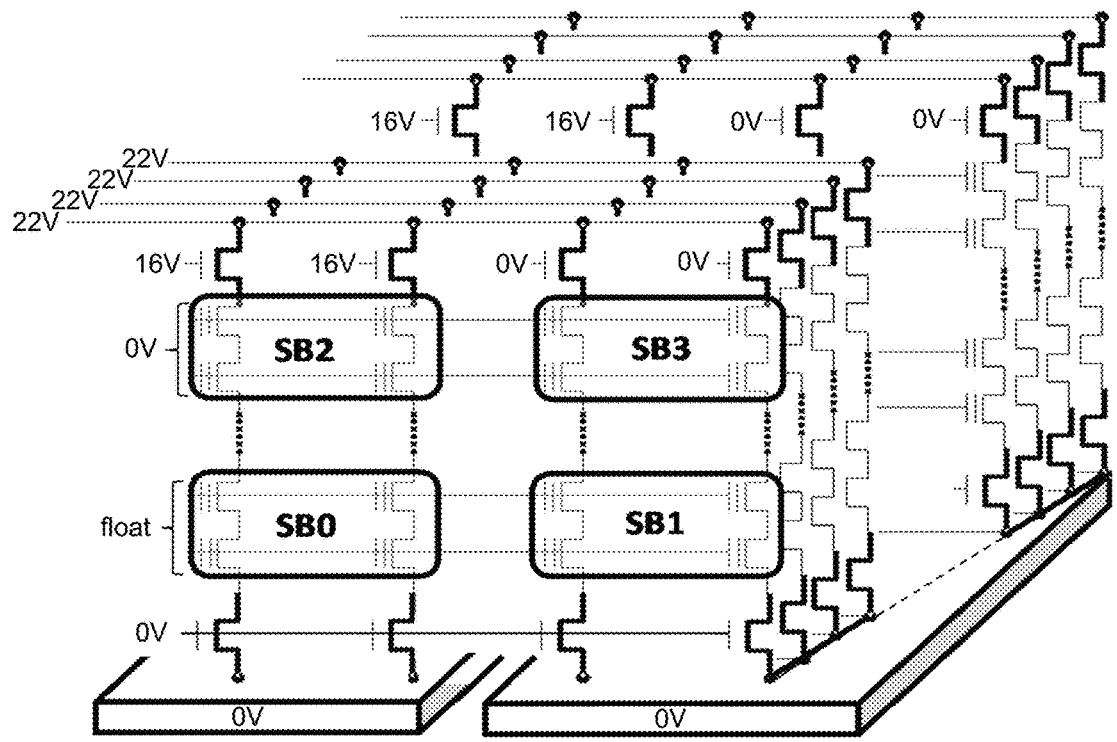
FIG. 7G depicts one embodiment of the physical memory block of FIG. 7F during an erase operation for the sub-block SB2.

FIG. 7G depicts one embodiment of the physical memory block of FIG. 7F during an erase operation for the sub-block SB2. As depicted, the bit lines that include bit line BL0 have been set to an erase voltage of 22V, the drain-side select gate lines SGD0-SGD1 have been set to 16V, the drain-side select gate lines SGD2-SGD3 have been set to 0V, the word lines connecting to the gates of the memory cell transistors within the sub-blocks SB2 and SB3 have been set to 0V, the word lines connecting to the gates of the memory cell transistors within the sub-blocks SB0 and SB1 have been floated, the source-side select gate line SGS0 has been set to 0V, the first buried source line BSL_0 has been set to 0V, and the second buried source line BSL_1 has been set to 0V. With these bias conditions, the memory cell transistors within the sub-block SB2 may be set into an erased state, while the memory cell transistors within the sub-blocks SB0-SB1 and SB3 are unselected and not erased.

Figure 7H:
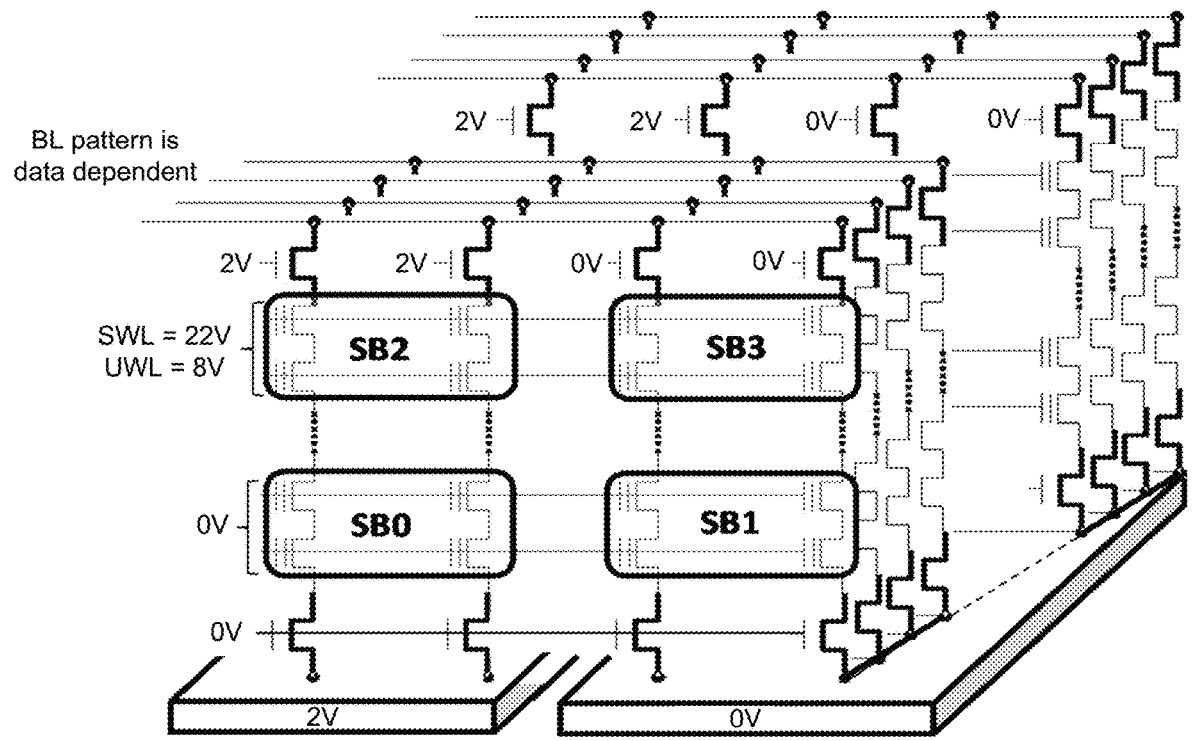
FIG. 7H depicts one embodiment of the physical memory block of FIG. 7F during a programming operation for the sub-block SB2.

FIG. 7H depicts one embodiment of the physical memory block of FIG. 7F during a programming operation for the sub-block SB2. As depicted, the bit lines that include bit line BL0 have been set to 0V or 2V depending on whether a memory cell transistor that is electrically connected to the bit line is to be programmed or program-inhibited. A memory cell transistor that is program-inhibited is prevented from being programmed. The applied bit line voltages to the bit lines during the programming operation is dependent on the data pattern to be programmed. As depicted in FIG. 7H, the drain-side select gate lines SGD0-SGD1 have been set to 2V, the drain-side select gate lines SGD2-SGD3 have been set to 0V, the unselected word lines (UWLs) connecting to the gates of the unselected memory cell transistors within the sub-blocks SB2 and SB3 have been set to the pass voltage of 8V, the selected word line (SWL) connecting to the gates of the selected memory cell transistors within the sub-blocks SB2 and SB3 has been set to the programming voltage of 22V, the word lines connecting to the gates of the memory cell transistors within the sub-blocks SB0 and SB1 have been set to an unselected voltage of 0V, the source-side select gate line SGS0 has been set to 0V, the first buried source line BSL_0 has been set to 2V, and the second buried source line BSL_1 has been set to 0V. With these bias conditions, the memory cell transistors within the sub-block SB2 that are selected for programming may be set into a programmed data state, while the memory cell transistors within the sub-blocks SB0-SB1 and SB3 are unselected and not programmed.

Figure 7I:
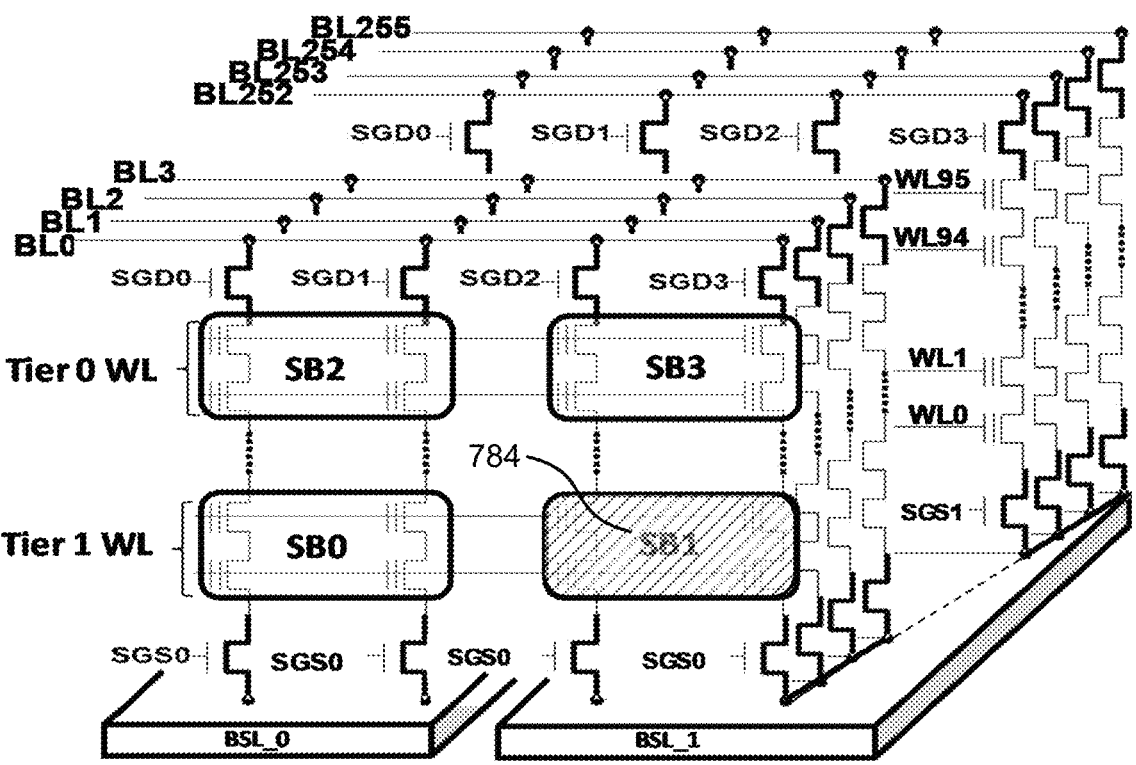
FIGS. 7I-7J depict various embodiments of a physical memory block that includes four sub-blocks SB0-SB3.
Figure 7J:
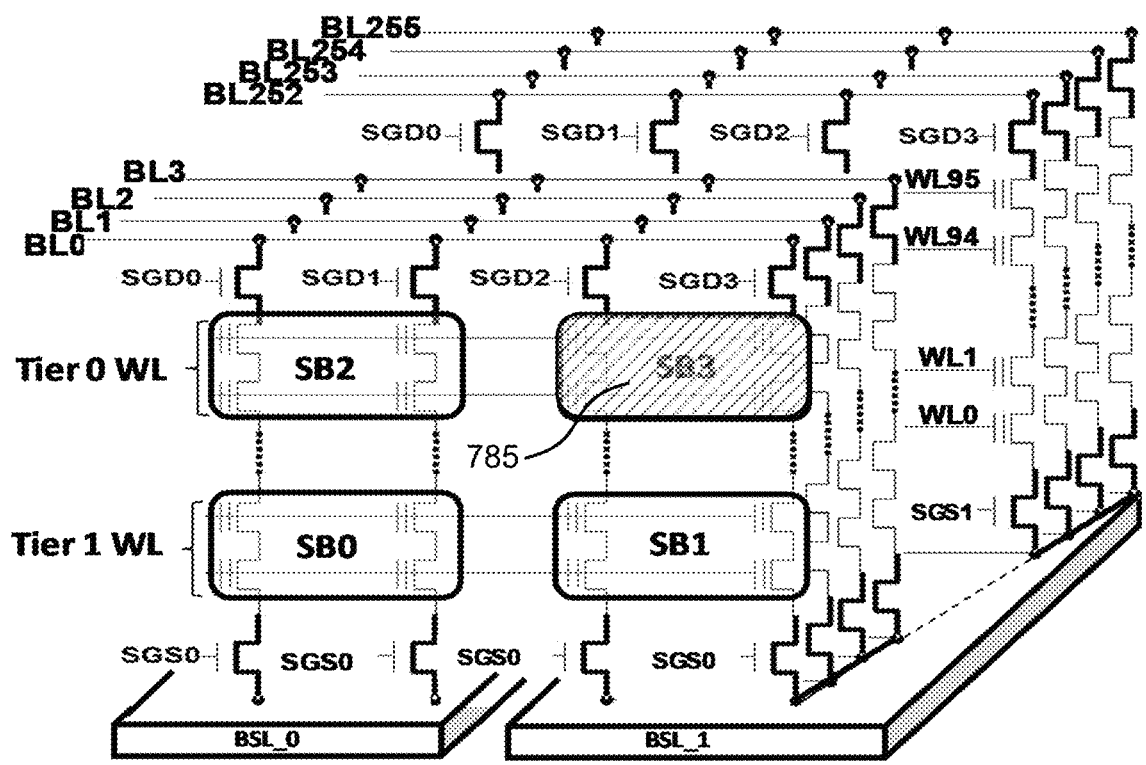

FIGS. 7I-7J depict various embodiments of a physical memory block that includes four sub-blocks SB0-SB3. As depicted in FIG. 7I, during a memory operation, the sub-block SB1 784 may be selected, while the sub-blocks SB0 and SB2-SB3 are unselected. Bias conditions similar to those depicted in FIG. 7D may be applied to the physical memory block of FIG. 7I in order to erase the memory cell transistors within the sub-block SB1 784, with the exception that the first buried source line BSL_0 would be set to an unselected voltage of 0V and the second buried source line BSL_1 would be set to an erase voltage of 22V.

As depicted in FIG. 7J, during a memory operation, the sub-block SB3 785 may be selected, while the sub-blocks SB0-SB2 are unselected. Bias conditions similar to those depicted in FIG. 7G may be applied to the physical memory block of FIG. 7J in order to erase the memory cell transistors within the sub-block SB3 785, with the exception that the drain-side select gate lines SGD0-SGD1 would be set to 0V and the drain-side select gate lines SGD2-SGD3 would be set to 16V.

Figure 8A:
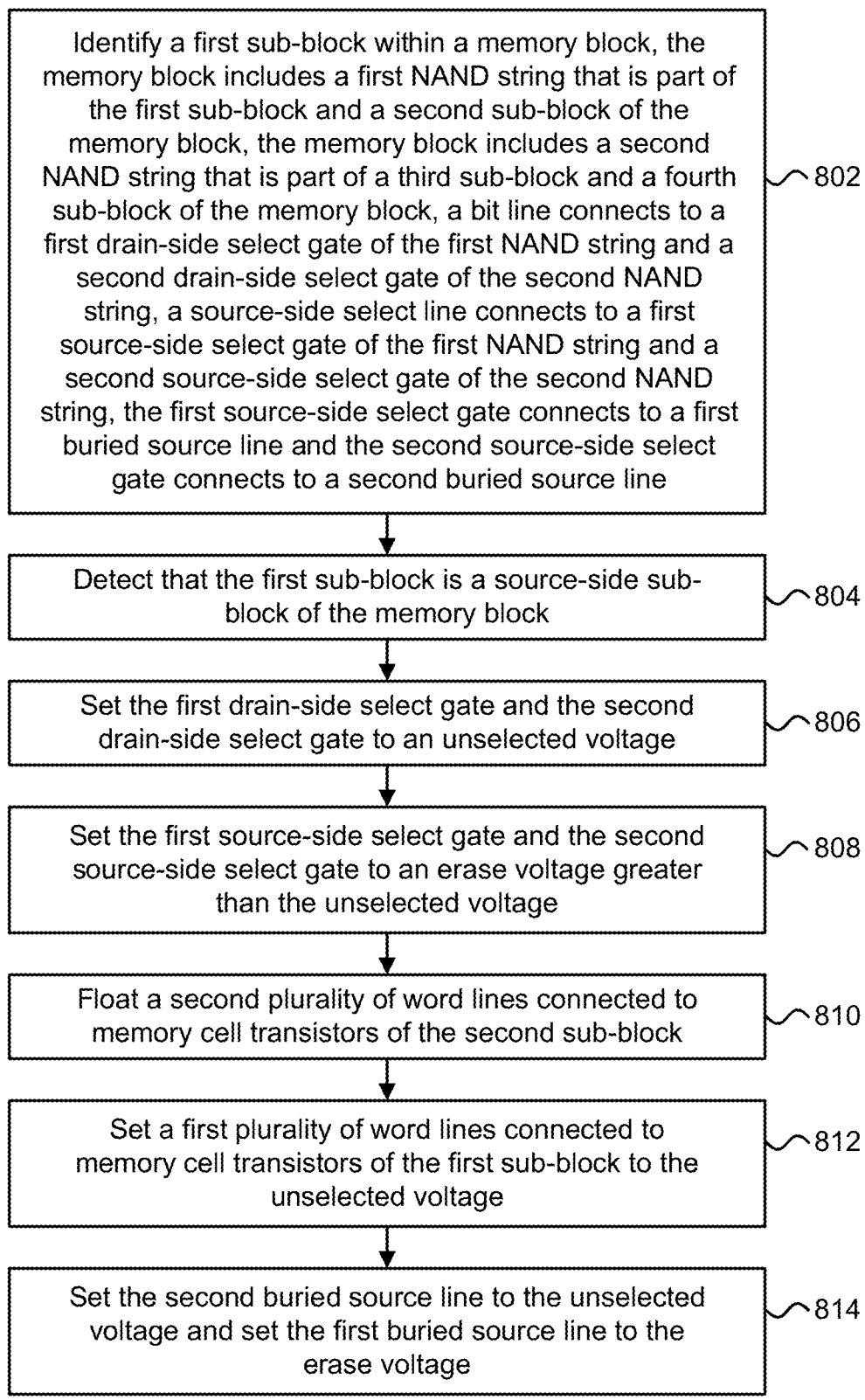
FIG. 8A is a flowchart describing one embodiment of a process for erasing memory cell transistors within a sub-block of a physical memory block.

FIG. 8A is a flowchart describing one embodiment of a process for erasing memory cell transistors within a sub-block of a physical memory block. The physical memory block may correspond with the physical memory block depicted in FIG. 7D. In one embodiment, the process of FIG. 8A may be performed by a memory chip controller, such as the memory chip controller 105 depicted in FIG. 1A. In another embodiment, the process of FIG. 8A may be performed by one or more control circuits arranged on a memory chip, such as memory core control circuits 104 on memory chip 102 in FIG. 1A.

In step 802, a first sub-block within a memory block is identified. The memory block may be identified via a word line address and a bit line address corresponding with the memory block. In one embodiment, the memory block may correspond with the physical memory block depicted in FIG. 7C and the first sub-block may correspond with sub-block SB0 782 in FIG. 7C. The memory block may include a first NAND string that is part of the first sub-block and a second sub-block of the memory block; the first NAND string may extend through both the first sub-block and the second sub-block. The memory block may include a second NAND string that is part of a third sub-block and a fourth sub-block of the memory block; the second NAND string may extend through both the third sub-block and the fourth sub-block. A bit line connects to a first drain-side select gate of the first NAND string and a second drain-side select gate of the second NAND string. A source-side select line connects to a first source-side select gate of the first NAND string and a second source-side select gate of the second NAND string. The first source-side select gate may be connected to a first buried source line and the second source-side select gate may be connected to a second buried source line. The first buried source line may comprise doped polysilicon, such as n-type polysilicon.

In step 804, it is detected that the first sub-block is a source-side sub-block of the memory block. In one example, it may be detected that the first sub-block comprises a source-side sub-block if the first sub-block abuts or is closest to the source-side select gate transistors for the memory block. It may be detected that the first sub-block comprises a source-side sub-block based on a row and column address for selected memory cells or based on a word line address and bit line address for the selected memory cell transistors. In step 806, the first drain-side select gate and the second drain-side select gate are set to an unselected voltage (e.g., 0V). In step 808, the first source-side select gate and the second source-side select gate are set to an erase voltage (e.g., 22V or a voltage between 18V and 23V) greater than the unselected voltage or to a bias voltage (e.g., 16V or a voltage between 11V and 17V) greater than the unselected voltage. In step 810, a second plurality of word lines connected to memory cell transistors of the second sub-block are floated. In some embodiments, the second plurality of word lines connected to the memory cell transistors of the second sub-block may be set to 0V instead of being floated. In step 812, a first plurality of word lines connected to memory cell transistors of the first sub-block is set to the unselected voltage (e.g., 0V). In step 814, the second buried source line is set to the unselected voltage (e.g., 0V) and the first buried source line is set to the erase voltage (e.g., 22V). In one embodiment, the bias conditions depicted in FIG. 7D may be used to erase memory cell transistors within a source-side sub-block, such as the sub-block SB0 782 in FIG. 7C.

Figure 8B:
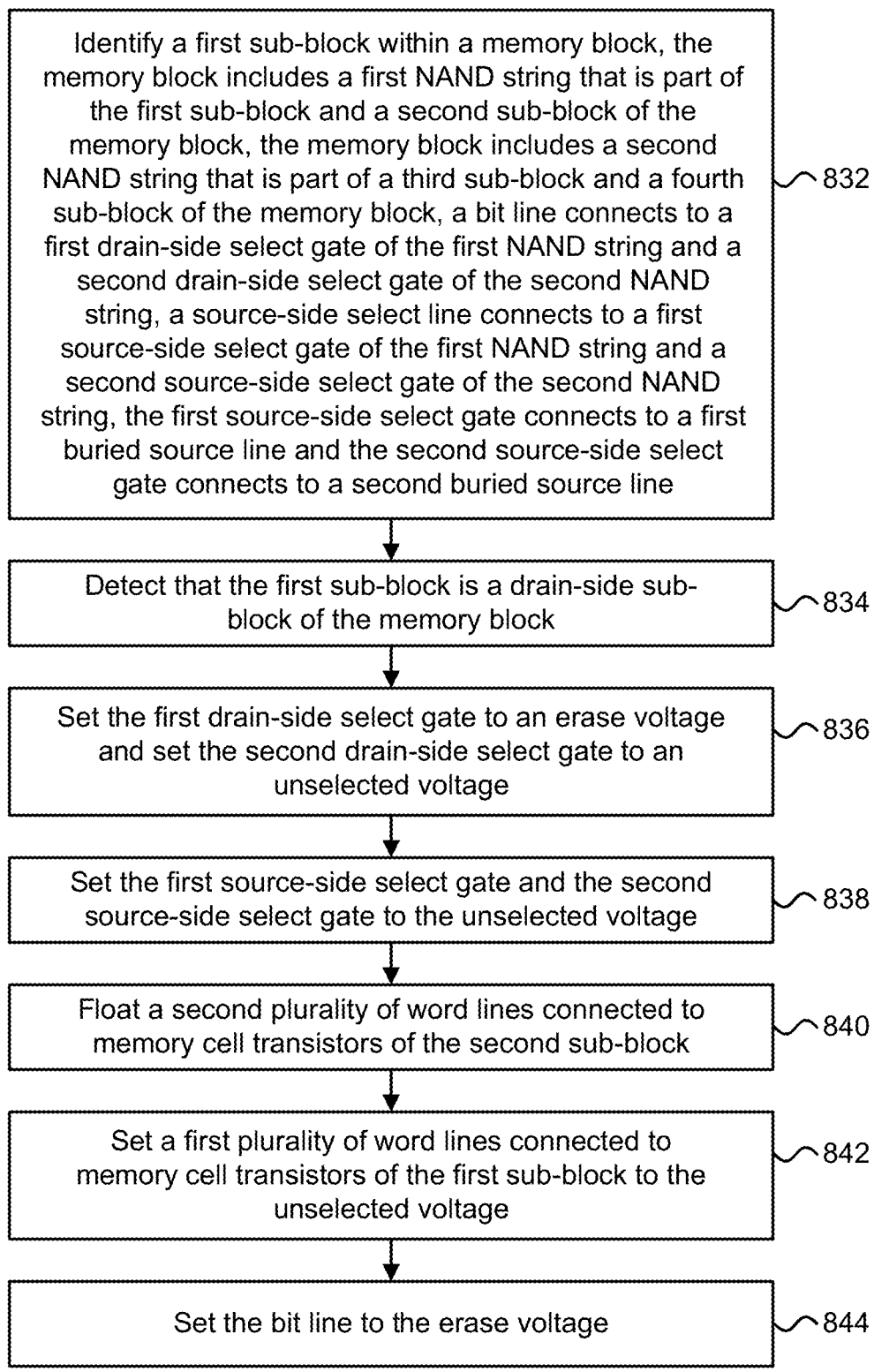
FIG. 8B is a flowchart describing another embodiment of a process for erasing memory cell transistors within a sub-block of a physical memory block.

FIG. 8B is a flowchart describing another embodiment of a process for erasing memory cell transistors within a sub-block of a physical memory block. The physical memory block may correspond with the physical memory block depicted in FIG. 7G. In one embodiment, the process of FIG. 8B may be performed by a memory chip controller, such as the memory chip controller 105 depicted in FIG. 1A. In another embodiment, the process of FIG. 8B may be performed by one or more control circuits arranged on a memory chip, such as memory core control circuits 104 on memory chip 102 in FIG. 1A.

In step 832, a first sub-block within a memory block is identified. The memory block may be identified via a word line addresses and/or a bit line addresses corresponding with the memory block. In one embodiment, the memory block may correspond with the physical memory block depicted in FIG. 7F and the first sub-block may correspond with sub-block SB2 783 in FIG. 7F. The memory block includes a first NAND string that is part of the first sub-block and a second sub-block of the memory block; the first NAND string may extend through both the first sub-block and the second sub-block. The memory block includes a second NAND string that is part of a third sub-block and a fourth sub-block of the memory block; the second NAND string may extend through both the third sub-block and the fourth sub-block. A bit line connects to a first drain-side select gate of the first NAND string and a second drain-side select gate of the second NAND string. A source-side select line connects to a first source-side select gate of the first NAND string and a second source-side select gate of the second NAND string. The first source-side select gate may be connected to a first buried source line and the second source-side select gate may be connected to a second buried source line. The first buried source line may comprise a first region of doped polysilicon, such as n-type region of polysilicon, and the second buried source line may comprise a second region of doped polysilicon that is electrically isolated from the first region of doped polysilicon.

In step 834, it is detected that the first sub-block comprises a drain-side sub-block of the memory block. In one embodiment, it is detected that the first sub-block comprises a drain-side sub-block of the memory block if the first sub-block abuts or directly connects to drain-side select gates for the memory block. It may be detected that the first sub-block comprises a drain-side sub-block based on a row and column address for selected memory cells or based on a word line address and bit line address for selected memory cell transistors. In step 836, the first drain-side select gate is set to an erase voltage (e.g., 22V) or a bias voltage (e.g., 16V) that is greater than an unselected voltage (e.g., 0V). The second drain-side select gate is set to the unselected voltage (e.g., 0V). In step 838, the first source-side select gate is set to the unselected voltage and the second source-side select gate is set to the unselected voltage. In step 840, a second plurality of word lines connected to memory cell transistors of the second sub-block are floated. In some cases, the second plurality of word lines connected to the memory cell transistors of the second sub-block are set to the unselected voltage instead of being floated. In step 842, a first plurality of word lines connected to memory cell transistors of the first sub-block is set to the unselected voltage (e.g., 0V). In step 844, the bit line is set to the erase voltage (e.g., 22V). In one embodiment, the bias conditions depicted in FIG. 7G may be used to erase memory cell transistors within a drain-side sub-block, such as the sub-block SB2 783 in FIG. 7F.

One embodiment of the disclosed technology includes a memory block (e.g., a physical memory block such as the physical memory block depicted in FIG. 7C) and one or more control circuits in communication with the memory block. The memory block including a first NAND string and a second NAND string. The first NAND string extends through a first sub-block and a second sub-block of the memory block. The second NAND string extends through a third sub-block and a fourth sub-block of the memory block memory. A source-side select line connects to a first source-side select gate transistor of the first NAND string and connects to a second source-side select gate transistor of the second NAND string. A bit line connects to a first drain-side select gate transistor of the first NAND string and a second drain-side select gate transistor of the second NAND string. The first source-side select gate transistor connects to a first buried source line and the second source-side select gate transistor connects to a second buried source line that is electrically isolated from the first buried source line. The one or more control circuits configured to set the first drain-side select gate transistor and the second drain-side select gate transistor into a non-conducting state during an erase operation. The one or more control circuits configured to set the source-side select line to a first voltage during the erase operation and set a first plurality of word lines connected to memory cell transistors of the first sub-block to a second voltage less than the first voltage during the erase operation. The one or more control circuits configured to set the second buried source line to the second voltage and set the first buried source line to an erase voltage greater than the first voltage during the erase operation.

One embodiment of the disclosed technology includes a memory block (e.g., a physical memory block such as the physical memory block depicted in FIG. 7C) and one or more control circuits in communication with the memory block. The memory block including a first NAND string and a second NAND string. The first NAND string extends through both a first sub-block and a second sub-block of the memory block. The second NAND string extends through both a third sub-block and a fourth sub-block of the memory block memory. A source-side select line connects to a first source-side select gate transistor of the first NAND string and connects to a second source-side select gate transistor of the second NAND string. A bit line connects to a first drain-side select gate transistor of the first NAND string and a second drain-side select gate transistor of the second NAND string. The first source-side select gate transistor connects to a first buried source line and the second source-side select gate transistor connects to a second buried source line that is electrically isolated from the first buried source line. The one or more control circuits configured to set a gate of the first drain-side select gate transistor to a first voltage and set a gate of the second drain-side select gate transistor to a second voltage less than the first voltage during an erase operation. The one or more control circuits configured to set the source-side select line to the second voltage during the erase operation and set a second plurality of word lines connected to memory cell transistors of the second sub-block to the second voltage during the erase operation. The one or more control circuits configured to set the bit line to an erase voltage greater than the first voltage during the erase operation.

One embodiment of the disclosed technology includes identifying a first sub-block within a physical memory block. The physical memory block including a first NAND string and a second NAND string. The first NAND string extends through a first sub-block and a second sub-block of the memory block. The second NAND string extends through a third sub-block and a fourth sub-block of the memory block memory. A source-side select line connects to a first source-side select gate transistor of the first NAND string and connects to a second source-side select gate transistor of the second NAND string. A bit line connects to a first drain-side select gate transistor of the first NAND string and a second drain-side select gate transistor of the second NAND string. The first source-side select gate transistor connects to a first buried source line and the second source-side select gate transistor connects to a second buried source line that is electrically isolated from the first buried source line. The method further comprises setting the first drain-side select gate transistor and the second drain-side select gate transistor into a non-conducting state during an erase operation, setting the source-side select line to a first voltage during the erase operation, floating a second plurality of word lines connected to memory cell transistors of the second sub-block during the erase operation, setting a first plurality of word lines connected to memory cell transistors of the first sub-block to a second voltage less than the first voltage during the erase operation, setting the second buried source line to the second voltage, and setting the first buried source line to an erase voltage greater than the first voltage during the erase operation.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a physical memory block including a first NAND string and a second NAND string, the first NAND string includes a first drain-side select gate transistor and a first source-side select gate transistor, the second NAND string includes a second drain-side select gate transistor and a second source-side select gate transistor, the first NAND string extends through both a first sub-block and a second sub-block of the physical memory block, the second NAND string extends through both a third sub-block and a fourth sub-block of the physical memory block;
a source-side select line configured to control the first source-side select gate transistor of the first NAND string and control the second source-side select gate transistor of the second NAND string;
a bit line connected to the first drain-side select gate transistor of the first NAND string and to the second drain-side select gate transistor of the second NAND string;
a first buried source line;
a second buried source line, the first source-side select gate transistor connects to the first buried source line and the second source-side select gate transistor connects to the second buried source line; and
one or more control circuits in communication with the physical memory block, the one or more control circuits configured to set a gate of the first drain-side select gate transistor to a first voltage and set a gate of the second drain-side select gate transistor to a second voltage less than the first voltage during an erase operation, the one or more control circuits configured to set the source-side select line to the second voltage during the erase operation and set a second plurality of word lines connected to memory cell transistors of the second sub-block to the second voltage during the erase operation, the one or more control circuits configured to set the bit line to an erase voltage greater than the first voltage during the erase operation.

2. The apparatus of claim 1, wherein:
the one or more control circuits configured to float a first plurality of word lines connected to memory cell transistors of the first sub-block during the erase operation.

3. The apparatus of claim 1, wherein:
the one or more control circuits configured to set a first plurality of word lines connected to memory cell transistors of the first sub-block to the second voltage during the erase operation.

4. The apparatus of claim 1, wherein:
the first NAND string includes a tier select gate transistor; and
the one or more control circuits configured to set the tier select gate transistor into a non-conducting state during the erase operation.

5. The apparatus of claim 4, wherein:
the tier select gate transistor comprises a non-programmable transistor.

6. The apparatus of claim 1, wherein:
the second buried source line is electrically isolated from the first buried source line by a layer of silicon dioxide.

7. The apparatus of claim 1, wherein:
the first NAND string includes one or more dummy transistors arranged between memory cell transistors of the first sub-block and the memory cell transistors of the second sub-block; and
the one or more control circuits configured to set the one or more dummy transistors into a non-conducting state during the erase operation.

8. The apparatus of claim 1, wherein:
the first NAND string comprises a vertical NAND string that is arranged orthogonal to a semiconductor substrate.

9. The apparatus of claim 1, wherein:
the first NAND string includes floating gate transistors.

10. The apparatus of claim 1, wherein:
the one or more control circuits configured to detect that the first sub-block comprises a drain-side sub-block of the physical memory block prior to setting the gate of the first drain-side select gate transistor to the first voltage.

11. An apparatus, comprising:
one or more control circuits in communication with a memory block, the memory block includes a first NAND string and a second NAND string, the first NAND string includes a first drain-side select gate transistor and a first source-side select gate transistor, the second NAND string includes a second drain-side select gate transistor and a second source-side select gate transistor, the first NAND string extends through a first sub-block and a second sub-block of the memory block, the second NAND string extends through a third sub-block and a fourth sub-block of the memory block, gates of the first source-side select gate transistor and the second source-side select gate transistor are connected to a source-side select line, junctions of the first drain-side select gate transistor and the second drain-side select gate transistor are connected to a bit line, the first source-side select gate transistor connects to a first buried source line and the second source-side select gate transistor connects to a second buried source line, the one or more control circuits are configured to bias a gate of the first drain-side select gate transistor to a first voltage and bias a gate of the second drain-side select gate transistor to a second voltage less than the first voltage during an erase operation, the one or more control circuits are configured to bias the source-side select line to the second voltage during the erase operation and bias a second plurality of word lines connected to memory cell transistors of the second sub-block to the second voltage during the erase operation, the one or more control circuits are configured to bias the bit line to an erase voltage greater than the first voltage during the erase operation.

12. The apparatus of claim 11, wherein:
the second buried source line is electrically isolated from the first buried source line by a layer of silicon dioxide.

13. The apparatus of claim 11, wherein:
the first NAND string includes a tier select gate transistor.

14. The apparatus of claim 13, wherein:
the one or more control circuits are configured to set the tier select gate transistor into a non-conducting state during the erase operation.

15. The apparatus of claim 13, wherein:
the tier select gate transistor comprises a programmable transistor.

16. The apparatus of claim 11, wherein:
the one or more control circuits are configured to float a first plurality of word lines connected to memory cell transistors of the first sub-block during the erase operation.

17. The apparatus of claim 11, wherein:
the one or more control circuits are configured to set a first plurality of word lines connected to memory cell transistors of the first sub-block to the second voltage during the erase operation.

18. The apparatus of claim 11, wherein:
the first NAND string comprises a vertical NAND string that is arranged orthogonal to a semiconductor substrate.

19. A method, comprising:
identifying a first sub-block within a memory block, the memory block includes a first NAND string and a second NAND string, the first NAND string includes a first drain-side select gate transistor and a first source-side select gate transistor, the second NAND string includes a second drain-side select gate transistor and a second source-side select gate transistor, the first NAND string extends through the first sub-block and a second sub-block of the memory block, the second NAND string extends through a third sub-block and a fourth sub-block of the memory block, the first source-side select gate transistor and the second source-side select gate transistor are controlled by a source-side select line, the first drain-side select gate transistor and the second drain-side select gate transistor are connected to a bit line, the first source-side select gate transistor connects to a first buried source line and the second source-side select gate transistor connects to a second buried source line;

detecting that the first sub-block comprises a drain-side sub-block of the memory block prior to an erase operation;

biasing a gate of the first drain-side select gate transistor to a first voltage during the erase operation;

biasing a gate of the second drain-side select gate transistor to a second voltage less than the first voltage during the erase operation;

biasing the source-side select line to the second voltage during the erase operation;

biasing a second plurality of word lines connected to memory cell transistors of the second sub-block to the second voltage during the erase operation; and biasing the bit line to an erase voltage greater than the first voltage during the erase operation.

20. The method of claim 19, wherein:
the second buried source line is electrically isolated from the first buried source line by a layer of silicon dioxide.

* * * * *